(12) United States Patent
Becker et al.

(10) Patent No.: US 9,328,417 B2
(45) Date of Patent: *May 3, 2016

(54) SYSTEM AND METHOD FOR THIN FILM DEPOSITION

(75) Inventors: Jill S. Becker, Cambridge, MA (US); Roger R. Coutu, Hooksett, NH (US); Douwe J. Monsma, Amsterdam (NL)

(73) Assignee: Ultratech, Inc., San Jose, CA (US)

( * ) Notice: Subject to any disclaimer, the term of this patent is extended or adjusted under 35 U.S.C. 154(b) by 653 days.

This patent is subject to a terminal disclaimer.

(21) Appl. No.: 12/609,319

(22) Filed: Oct. 30, 2009

(65) Prior Publication Data

US 2010/0166955 A1    Jul. 1, 2010

Related U.S. Application Data

(60) Provisional application No. 61/197,948, filed on Nov. 1, 2008, provisional application No. 61/208,875, filed on Feb. 27, 2009.

(51) Int. Cl.
  *C23C 16/458*    (2006.01)
  *C23C 16/44*     (2006.01)
  *C23C 16/455*    (2006.01)

(52) U.S. Cl.
  CPC ....... *C23C 16/4401* (2013.01); *C23C 16/45504* (2013.01); *C23C 16/45546* (2013.01); *C23C 16/45582* (2013.01)

(58) Field of Classification Search
  CPC .................................................. C23C 16/45582
  USPC ......................................................... 118/715
  See application file for complete search history.

(56) References Cited

U.S. PATENT DOCUMENTS

| 4,294,871 A | 10/1981 | Hieber et al. |
| 4,907,534 A | 3/1990 | Huang et al. |
| 4,926,793 A | 5/1990 | Arima et al. |

(Continued)

OTHER PUBLICATIONS

Beneq, Thin Film System—TFS 500, Nov. 2007.

(Continued)

*Primary Examiner* — Parviz Hassanzadeh
*Assistant Examiner* — Nathan K Ford
(74) *Attorney, Agent, or Firm* — Peters Verny, LLP

(57) ABSTRACT

A reaction chamber assembly suitable for forming thin film deposition layers onto solid substrates includes a reaction chamber and an input plenum for receiving source material from gas source containers and delivering a flow of source material into the reaction chamber uniformly distributed across a substrate support width. An output plenum connected between the reaction chamber and a vacuum pump uniformly removes an outflow of material from the reaction chamber across the substrate support width. The input plenum is configured to expand a volume of the source material and deliver the source material to the substrate support area with uniform source material flow distribution across the substrate support width. The output plenum is configured to remove the outflow material across the entire substrate support width and to compress the volume of outflow material prior to the outflow material exiting the output plenum. The resulting source material flow over substrates supported in the substrate support area is uniformly distributed across the substrate support width and unidirectional with a uniform flow velocity. The configuration of the reaction chamber assembly reduces pump down times.

24 Claims, 18 Drawing Sheets

FLOW DYNAMICS THROUGH OVEN (SIDE VIEW)

(56) References Cited

U.S. PATENT DOCUMENTS

| | | |
|---|---|---|
| 5,082,547 A | 1/1992 | DeLarge |
| 5,551,982 A | 9/1996 | Anderson et al. |
| 5,582,866 A | 12/1996 | White |
| 5,685,906 A | 11/1997 | Dletze et al. |
| 5,711,811 A * | 1/1998 | Suntola et al. ............ 118/719 |
| 5,855,681 A | 1/1999 | Maydan et al. |
| 5,879,459 A | 3/1999 | Gadgil et al. |
| 6,015,590 A | 1/2000 | Suntola et al. |
| 6,080,241 A | 6/2000 | Li et al. |
| H1888 H | 10/2000 | Quartarone et al. |
| 6,139,641 A | 10/2000 | Inokuchi et al. |
| 6,174,377 B1 | 1/2001 | Doering et al. |
| 6,194,030 B1 | 2/2001 | Psaute |
| 6,235,634 B1 | 5/2001 | White et al. |
| 6,258,170 B1 | 7/2001 | Somekh et al. |
| 6,323,463 B1 | 11/2001 | Davis et al. |
| 6,342,277 B1 | 1/2002 | Sherman |
| 6,503,330 B1 | 1/2003 | Sneh et al. |
| 6,506,352 B1 | 1/2003 | Lindfors et al. |
| 6,511,539 B1 | 1/2003 | Raaijmakers |
| 6,572,705 B1 | 6/2003 | Suntola et al. |
| 6,579,374 B2 | 6/2003 | Bondestam et al. |
| 6,613,587 B1 | 9/2003 | Carpenter et al. |
| 6,616,986 B2 | 9/2003 | Sherman |
| 6,652,924 B2 | 11/2003 | Sherman |
| 6,730,174 B2 * | 5/2004 | Liu et al. ............ 118/715 |
| 6,730,367 B2 | 5/2004 | Sandhu |
| 6,743,475 B2 | 6/2004 | Skarp et al. |
| 6,764,546 B2 | 7/2004 | Raaijmakers |
| 6,814,813 B2 | 11/2004 | Dando et al. |
| 6,869,641 B2 | 3/2005 | Schmitt |
| 6,884,465 B2 | 4/2005 | Skarp et al. |
| 6,889,627 B1 * | 5/2005 | Hao ............ 118/723 R |
| 6,902,624 B2 | 6/2005 | Seidel et al. |
| 6,911,092 B2 | 6/2005 | Sneh |
| 7,015,426 B2 | 3/2006 | Doering et al. |
| 7,020,981 B2 | 4/2006 | Shero et al. |
| 7,182,816 B2 | 2/2007 | Kleshock et al. |
| 7,387,686 B2 | 6/2008 | Iwamoto et al. |
| 7,399,499 B2 | 7/2008 | Basceri |
| 7,410,671 B2 | 8/2008 | Sherman |
| 7,431,767 B2 | 10/2008 | Raaijmakers |
| 2001/0011526 A1 | 8/2001 | Doering et al. |
| 2002/0041931 A1 | 4/2002 | Suntola et al. |
| 2002/0073924 A1 | 6/2002 | Chiang et al. |
| 2003/0024477 A1 | 2/2003 | Okuda et al. |
| 2003/0150560 A1 * | 8/2003 | Kinnard et al. ........ 156/345.33 |
| 2003/0165615 A1 | 9/2003 | Aaltonen et al. |
| 2003/0213560 A1 | 11/2003 | Wang et al. |
| 2004/0216665 A1 | 11/2004 | Soininen et al. |
| 2005/0016471 A1 | 1/2005 | Chiang et al. |
| 2005/0045102 A1 | 3/2005 | Zheng et al. |
| 2005/0173068 A1 | 8/2005 | Chen et al. |
| 2005/0188923 A1 | 9/2005 | Cook et al. |
| 2006/0021573 A1 | 2/2006 | Monsma et al. |
| 2006/0032586 A1 | 2/2006 | Choi et al. |
| 2006/0051940 A1 | 3/2006 | Todd et al. |
| 2006/0137608 A1 | 6/2006 | Choi et al. |
| 2006/0188658 A1 | 8/2006 | Grant |
| 2006/0196418 A1 | 9/2006 | Lindfors et al. |
| 2006/0266289 A1 | 11/2006 | Verghese et al. |
| 2007/0026540 A1 | 2/2007 | van Nooten et al. |
| 2007/0051312 A1 | 3/2007 | Sneh |
| 2007/0119370 A1 | 5/2007 | Ma et al. |
| 2007/0221128 A1 | 9/2007 | Choi et al. |
| 2007/0231246 A1 * | 10/2007 | Hwang et al. ............ 423/460 |
| 2007/0264840 A1 | 11/2007 | Itatani et al. |
| 2007/0295274 A1 | 12/2007 | Webb et al. |
| 2008/0041307 A1 | 2/2008 | Nguyen et al. |
| 2008/0063798 A1 | 3/2008 | Kher et al. |
| 2008/0069955 A1 | 3/2008 | Hong et al. |
| 2008/0075858 A1 | 3/2008 | Koh |
| 2008/0081114 A1 | 4/2008 | Johanson et al. |
| 2008/0107809 A1 | 5/2008 | Wu et al. |
| 2008/0118663 A1 | 5/2008 | Choi et al. |
| 2008/0131601 A1 | 6/2008 | Kim et al. |
| 2008/0138518 A1 | 6/2008 | Suntola et al. |
| 2009/0035949 A1 | 2/2009 | Niinisto et al. |
| 2010/0247763 A1 | 9/2010 | Coutu et al. |

OTHER PUBLICATIONS

Cambridge Nanotech, ALD International 2008 Brugge, Belgium, Jun. 29-Jul. 3, 2008.

Cambridge Nanotech, Tahiti ALD System Proposal for Qualcomm MEMS Technology, Nov. 17, 2008.

Cambridge Nanotech, Tahiti Design Concept and Team, Nov. 17, 2008.

Kostamo et al., Novel Batch ALD Reactor Design for Advanced Microelectronics and Nanotechnology Manufacturing, AVS 8th International Conference on Atomic Layer Deposition, Nov. 20, 2008.

Lindfors et al., Automated Handling of Substrates in an ALD Reactor, AVS 7th International Conference on Atomic Layer Deposition, Sep. 19, 2007.

Picosun, Sunale P-Series ALD Process Tools, Oct. 29, 2008.

Picosun, Sunale R-Series ALD Process Tools, Oct. 29, 2008.

Suntola et al., ALD for advanced semiconductor and nanotechnology manufacturing, Sep. 12, 2007.

* cited by examiner

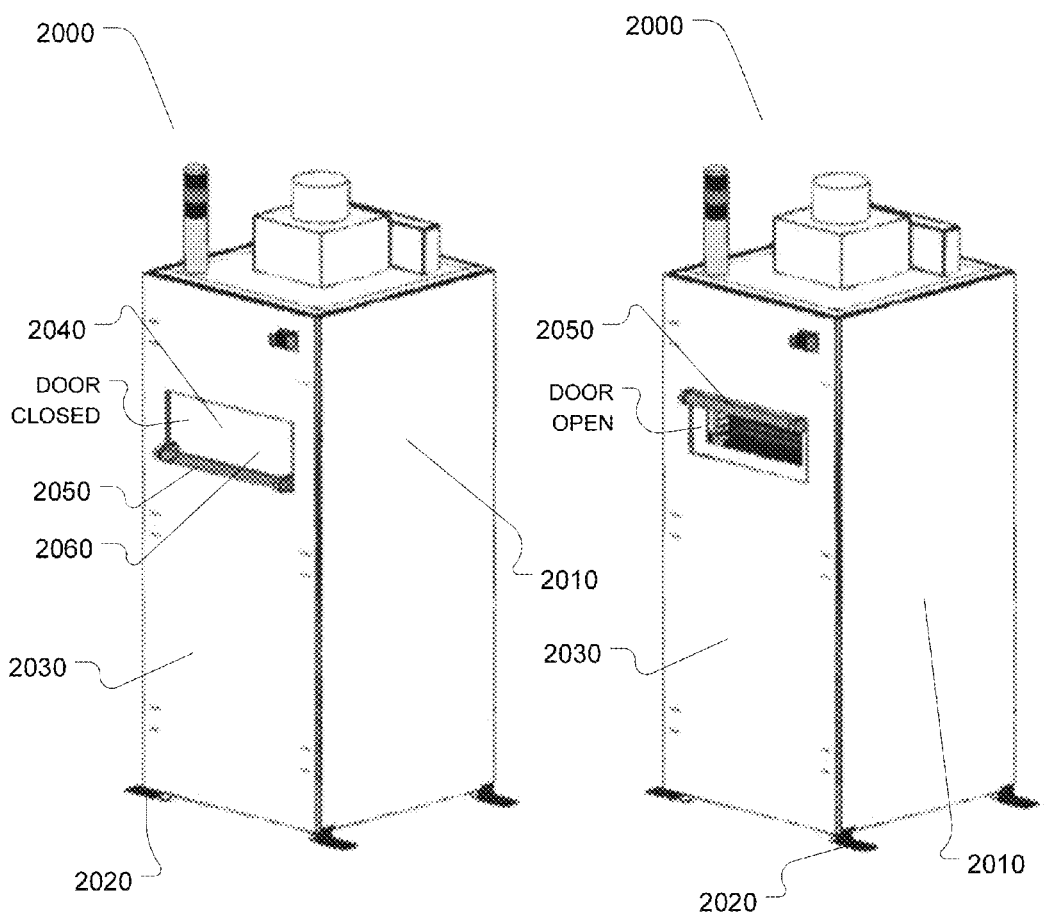

FIRST CHAMBER ASSEMBLY (EXPLODED VIEW)

FIRST CHAMBER ASSEMBLY (ASSEMBLED)

SIDE CUTAWAY VIEW

BACK CUTAWAY VIEW

BOTTOM LINER WALL (TOP VIEW)

SUBSTRATE TRAY

FLOW DYNAMICS THROUGH OVEN (SIDE VIEW)

DUAL CHAMBER TOWER

CHAMBER ASSEMBLY - 1

CHAMBER ASSEMBLY - 2

CHAMBER ASSEMBLY - 3

WELDED CHAMBER LINER ASSEMBLY

EXPLODED SECTION VIEW

OUTER WALL ASSEMBLY**

EXPANDED CHAMBER ASSEMBLY

EXPLODED VIEW OF
EXPANDED CHAMBER ASSEMBLY

FLOW DYNAMICS THROUGH OVEN (CROSS-SECTIONAL VIEW)

SYSTEM AND METHOD FOR THIN FILM DEPOSITION

CROSS REFERENCE TO RELATED U.S. PATENT APPLICATIONS

The present application claims priority under 35 U.S.C. §119(e) to provisional U.S. patent application Ser. No. 61/197,948 filed Nov. 1, 2008, and provisional U.S. Patent Application Ser. No. 61/208,875 filed Feb. 27, 2009, both of which are incorporated herein by reference in its entirety and for all purposes.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright 2009, Cambridge NanoTech, Inc.

BACKGROUND OF THE INVENTION

1. Field of the Invention

The present invention relates to a reaction chamber assembly particularly suitable for thin film deposition by self-limiting deposition processes. In particular, the reaction chamber assembly provides improved gas flow dynamics and includes and input plenum disposed between precursor or reactant sources and a reaction chamber and may include an output plenum disposed between the reaction chamber and a vacuum source. Preferably, the input plenum encloses an input plenum conduit that continuously expands in volume from a first input end to a second output end that delivers precursors into the reaction chamber. Similarly, the output plenum encloses an output plenum conduit that continuously expands in volume from a first output end to a second input end that withdraws a gas outflow from the reaction chamber.

2. The Related Art

Reaction chamber assemblies for controlling Chemical Vapor Deposition (CVD),

Physical Vapor Deposition (PVD) and other thin film deposition processes are known and widely used in various industries. In particular, thin film deposition processing equipment is widely used to apply insulating, dielectric and conductive thin film layers onto various substrates and components such as semiconductor substrates, used to make semiconductor circuit devices, and onto transparent and semitransparent glasses and other substrates, used in optical and electro-optical devices. Generally a reaction chamber assembly used for thin film deposition includes a sustainably gas tight reaction chamber with the reaction chamber configured to support one or more substrates therein with selected surfaces thereof exposed for coating by thin film layers. A chamber aperture passes through a wall of the reaction chamber to provide access to the reaction chamber to install and remove the substrates. An access door associated with the chamber aperture is provided to close and gas-seal the chamber aperture during coating operations. In production environments, the loading and unloading process may be automated, e.g. by a robotic device, and in some applications the substrates may be loaded and unloaded from inside a clean room to prevent the substrates from becoming contaminated.

Conventional reaction chamber assemblies include a gas cabinet for supporting a plurality of gas supply containers filled with various pressurized gas precursors, various inert gases and other precursors that may be prepared as an aerosol, or the like, from containers filled with solid or liquid precursor materials. Conventional reaction chamber assemblies may include a vacuum pump and associated vacuum lines for drawing the reaction chamber down to a vacuum pressure and or for removing outflow from the reaction chamber. Conventional vacuum lines may include a filter or trap disposed between the reaction chamber and the vacuum pump for removing selected materials from the outflow. Conventional reaction chamber assemblies may include heaters for heating substrates, reaction chamber walls, precursors, filter or traps or other components to temperatures suitable for enhancing various chemical and physical reactions as required. In addition, some CVD and PVD reaction chamber assemblies may include a plasma generator for generating a partially ionized gas used to enhance the desired chemical and physical reactions at surfaces or the substrate.

Conventional reaction chamber assemblies include an electronic controller electrically interconnected with various devices such as pressure and temperature sensors, gas flow controllers, valves, motors, fans, pumps, actuators, and the like all used to operate the reaction chamber assembly to deposit thin films in a desired manner. The electronic controller may include one or more digital data processing elements, memories, user interface devices, video display devices, network adaptors, and the like, for carrying out logical operations, logging data, storing program steps and generally operating the reaction chamber assembly to carry out coating processes according to predefined coating recipes.

Thin film deposition processes are roughly divided into two classes, namely those configured for time-limited or self-limiting reactions and those configured for non-limiting reactions. Most industrial thin film deposition chamber assemblies are configured for performing non-limiting reactions. More specifically, non-limiting processes are preformed when two precursors are introduced into the reaction chamber simultaneously. A first precursor reacts with exposed substrate surfaces and alters the chemical or physical characteristics of the exposed substrate surfaces and thereafter a second precursor reacts with the altered substrate surfaces forming a first new solid material monolayer. Thereafter, the reaction repeats with the first precursor reacting with and altering the first monolayer and the second precursor reacting with the altered first monolayer and forming a second monolayer of new solid material. The non-limiting reaction process continues to repeat uninterrupted building up the thickness of the thin film of new solid material until the precursor supply is depleted or flushed from the reaction chamber.

In non-limiting reactions, an exposure time, defined as the length of time that a substrate is exposed to a supply of both precursors, is used as a control variable to control the thickness of a thin film deposition. In practice, the exposure time is the time between the start of the non-limiting reaction and the end of the non-limiting reaction, which is generally ended deliberately by purging the reaction chamber to remove both precursors. Non-limiting reactions are generally flux and concentration dependent. In particular, the exposure time to build up a desired thickness of a film layer depends on the chemical flux and concentration of the source material making contact with the exposed substrate surfaces wherein the source material may comprise both precursors plus a carrier gas. The chemical flux at an exposed surface is defined as a rate of flow of precursor molecules per unit area per unit time (e.g. Mols/m$^2$/sec). The chemical concentration is defined as a percentage of the total volume of source material that is precursor available to react with the exposed surfaces. Moreover, the flux and concentration may be different for each precursor.

Because non-limiting reactions are flux and concentration dependent, reaction chamber assemblies used for non-limiting reactions, such as CDV, are typically configured to direct a flow of source material to impinge upon substrate surfaces being coated in order to keep the source material flux and concentration at the coating surface maximized during the entire exposure time. Moreover, it is desirable to mix the source materials proximate to the coating surface to increase the flux and concentration of both precursors local to reaction cites. Typically, CVD systems utilize a showerhead comprising a plurality of flow nozzles uniformly disposed over the entire surface being coated to impinge the entire surface being coated with a flow of source material during the entire exposure time. Alternately, a single flow nozzle is directed at the surface being coated to impinge an area of the surface being coated source material while the substrate is moved past the nozzle during the exposure time. In both examples, gas flow proximate to the impinge point or area tends to turbulent flow, which promotes mixing of the source material. One example of a convention CVD reaction chamber assembly that utilizes a shower head positioned opposed to a substrate surface being coated is disclosed in U.S. Pat. No. 6,960,537 to Shero et al. entitled INCORPORATION OF NITROGEN INTO HIGH K DIELECTRIC FILMS. An example of a conventional CVD reaction chamber assembly that utilizes a nozzle head positioned opposed to a substrate surface being coated is disclosed in U.S. Pat. No. 5,651,827 to Aoyama et al. entitled SINGLE-WAFER HEAT TREATEMENT APPARATUS AND METHOD OF MANUFACTURING REACTOR VESSEL USED FOR SAME.

Self-limiting thin film deposition processes are preformed by introducing a first precursor into the reaction chamber to react with and alter the chemical or physical characteristics of the surfaces being coated, then flushing the first precursor from the reaction chamber, then introducing a second precursor the reaction chamber to react with the chemically or physically altered surfaces being coated to complete the formation a first new solid material monolayer and then flushing the second precursor from the reaction chamber. Second and subsequent thin film deposition layers may be added by repeating the cycle of introducing the first precursor to react with and alter the first new solid material monolayer, flushing the first precursor and introducing the second precursor to form a second and subsequent new solid material monolayers.

Self-limiting thin film deposition processes at least include atomic layer epitaxy (ALE) and atomic layer deposition (ALD). These processes are self-limiting because only one precursor is introduced into the reaction chamber at a time. A first precursor introduced into the reaction chamber reacts with exposed substrate surfaces, which only have a limited number of bonding cites available to react with the first precursor. The reaction between the surfaces being coated and the first precursor alters a chemical or physical state to the surface but once all of the available bonding cites form a bond with a first precursor, the reaction with the first precursor stops. A second precursor introduced into the reaction chamber reacts with the altered surfaces being coated to complete the formation of a new material monolayer but once all of the available bonding cites form a bond with the second precursor, the reaction with the second precursor stops. Thus each precursor introduction completes half a monolayer in a self-limiting manner.

Several advantages are gained by using self-limiting thin film deposition processes. These include very strict control of film thickness, since the films are formed one monolayer at a time, excellent film thickness uniformity over all exposed surfaces, good film composition homogeneity, lower reaction temperatures than CVD deposition processes, reduced precursor consumption and others. These and other advantages have lead to an increasing interest in using self-limiting thin film deposition processes in various industries. In a further distinction, extending exposure time in self-limiting thin film deposition processes does not increase layer thickness. Instead, layer thickness in self-limiting thin film deposition processes is controlled by selecting the number of deposition cycles or the number of monolayers formed. In a further advantage However, in most early transitions to convert CVD and other non-limiting thin film deposition processes and reaction chamber assemblies designs to self-limiting thin film deposition processes and reaction chamber designs more suitable for ALE, ALD and other self limiting reactions, the reaction chamber assembly designs and operating modes have not been optimized for the self-limiting processes. In particular, self-limiting reactions are not flux or concentration dependent. With only one precursor being introduced at a time and with each substrate bonding cite only being able to bond with one precursor molecule, once bonding occurs at a bonding cite, the reaction is over and there is no need to replenish the bonding cite with additional precursor molecules. Thus there is no need to direct a flow of source material to impinge upon substrate surfaces being coated since there is no need to increase flux and concentration at bonding cites and there is no need to mix source material at bonding cites since the source material only contains one precursor at a time. Instead, it is only necessary to provide sufficient precursor volume to make contact with and react with all of the surface bonding cites available on the exposed substrate surfaces. This subtle distinction has not been recognized by ALE and ALD reaction chamber assembly designers who continue to use showerheads and other devices to direct the flow of precursors onto or proximate to substrate surfaces, examples of which are disclosed in U.S. Pat. No. 6,911,092 and U.S. Pub. App. No.s 2007/026540, 2006/0137608, 2007/0051212, which all disclose showerhead devices used in a self-limiting thin film deposition reaction chamber assembly.

A disadvantage of self-limiting thin film deposition processes is that a large number of precursor cycles is required to build up appreciable film thickness since self-limiting film layer thickness is typically less than about 10 Å per monolayer. A further disadvantage of self-limiting thin film deposition processes is that the formation of each monolayer may require four gas introduction steps, e.g. an initial chamber purge, a first precursor introduction, a chamber purge and a second precursor introduction. Thus the cycle time to build up a several hundred Å layer thickness is considerably longer than comparable thickness build up cycles by non-limiting thin film deposition processes.

Thus there is a need in the art for a reaction chamber assembly optimized for self-limiting thin film deposition processes. More specifically, there is need to reduce self-limiting monolayer formation cycle times. More generally, there is a need in the art to increase the size of reaction chambers to handle larger substrates. There is a further need in the art to increase coating throughput by providing reaction chambers suited for batch coating cycles. There is a still further need in the art, to decrease scheduled or unscheduled down time of production oriented reaction chamber systems by providing a reaction chamber that can be easily and quickly decontaminated.

| List of Item Reference Numbers | |
|---|---|
| 1000 | Dual Chamber Gas Deposition System |
| 1100 | Vent |
| 1110 | Lighting Tower |
| 1120 | Upper Gas Deposition Chamber |
| 1130 | Right Side Face |
| 1135 | Upper Input Gas Supply |
| 1140 | Frame |
| 1145 | Upper Cross Frame Platform |
| 1150 | Lower Gas Deposition Chamber |
| 1155 | Lower Cross Frame Platform |
| 1160 | Lower Input Gas supply |
| 1165 | Electronic Controller |
| 1170 | Lower Load Lock Door |
| 1180 | Front Face |
| 1190 | Upper Load Lock Door |
| 1200 | Single User Interface |
| 2000 | First ALD System |
| 2010 | Floor Standing System Cabinet |
| 2020 | Cabinet Feet |
| 2030 | Cabinet Front Face |
| 2040 | Access Door |
| 2050 | Door Handle |
| 2060 | Outer Door Panel |
| 2070 | Inner Door Panel |
| 2080 | Door Cover |
| 2090 | Door Heater |
| 2100 | Insulation Layer |
| 2110 | Aluminum Plate |
| 2120 | Resistive Heating Element |
| 3000 | Chamber Assembly |
| 3050 | Removable Back panel |
| 3060 | Back Perimeter flange |
| 3070 | Outer Volume |
| 3080 | Movable Access Door |
| 3090 | Support Structure |
| 3100 | Door Actuators |
| 3110 | Heating Elements |
| 3120 | Thermal Insulation Layers |
| 3125 | Reaction Chamber |
| 3130 | Right Rectangular Through Aperture |
| 3140 | Left Rectangular Through Aperture |
| 3150 | Input Plenum |
| 3160 | Input Plenum Flange |
| 3170 | Top Input Plenum Wall |
| 3180 | Bottom Input Plenum Wall |
| 3190 | Input Plenum Side Wall |
| 3200 | Input Plenum Side Wall |
| 3210 | Input Plenum Chamber |
| 3220 | Input Plenum End Wall |
| 3230 | Input Port Assembly |
| 3240 | Gas Supply Module |
| 3250 | Output Plenum |
| 3260 | Output Plenum Flange |
| 3270 | Top Output Plenum Wall |
| 3280 | Bottom Output Plenum Wall |
| 3290 | Output Plenum Side Wall |
| 3300 | Output Plenum Chamber |
| 3310 | Exit Port Assembly |
| 3320 | Exit Port Module |
| 3330 | Stop Valve |
| 3340 | Vacuum Pressure Gauge |
| 3350 | Substrate Support Surface |
| 3360 | Back Panel Eye Bolts |
| 3370 | Cone-Shaped Passage |
| 3380 | Liner Fasteners |
| 3390 | Pin Actuator Assembly |
| 3400 | Lift Post |
| 3410 | Pneumatic Cylinder and Piston Assembly |
| 3420 | Vacuum Bellows |
| 3430 | Circular Through Hole |
| 3440 | Guide Rods |
| 3450 | Stiffening Ribs |
| 4000 | First Reaction Chamber Assembly |
| 4010 | Outer Wall Assembly |
| 4020 | Removable Liner |
| 4025 | Front Face |
| 4030 | Input Port Assembly |
| 4040 | Exit Port Assembly |
| 4050 | Top Outer Wall |
| 4060 | Bottom Outer Wall |
| 4070 | Right Side Outer Wall |
| 4080 | Left Side Outer Wall |
| 4090 | Back Outer Wall |
| 4095 | Front Outer Wall |
| 4100 | Outer Aperture |
| 4110 | Outer Volume |
| 4120 | Resistive Heating Elements |
| 4130 | Top Liner Wall |
| 4140 | Bottom Liner Wall |
| 4150 | Right Side Liner Wall |
| 4160 | Left Side Liner Wall |
| 4170 | Back Liner Wall |
| 4180 | Chamber Aperture |
| 4190 | Reaction Chamber |
| 4200 | Rectangular Flange Portion |
| 4205 | Rectangular Recess |
| 4210 | Substrate Tray |
| 4215 | Clearance Gap Volume |
| 4220 | Bottom Substrate Tray |
| 4230 | Tray Supports |
| 4240 | Trap |
| 4250 | Vacuum Valve |
| 4260 | Cone-Shaped Conduit |
| 4270 | Pressure Gauge |
| 4280 | Cylindrical Flange |
| 4290 | Trap Seal |
| 4300 | Attaching Screws |
| 4310 | |
| 4320 | First O-ring Seal |
| 4330 | Second O-ring Seal |
| 4340 | |
| 4350 | Gas Input Port |
| 4360 | Gas Output Port |
| 4370 | Exit Port Assembly |
| 4380 | Tray Bottom Surface |
| 4390 | Stop Pins |
| 4400 | Tray Top Surface |
| 4500 | Exit Port |
| 6000 | Removable Liner |
| 6010 | Liner Base Wall |
| 6020 | Liner Top Wall |
| 6030 | Chamber Aperture |
| 6040 | Liner Back Wall |
| 6050 | Right Liner Aperture |
| 6060 | Left Liner Aperture |
| 6070 | Liner Lifting Handle |
| 6080 | Tooling Ball |
| 6090 | Liner Back Aperture |
| 7000 | Substrate |
| 7010 | |
| 7015 | Input Plenum Liner |
| 7020 | Top Plenum Liner Wall |
| 7030 | Bottom Plenum Liner Wall |
| 7040 | Rectangular Fluid Conduit |
| 7050 | Input Plenum Liner Flange |
| 7060 | Bottom Plenum Liner Wall Top Surface |
| 7070 | (not used) |
| 7080 | Output Plenum Liner |
| 7090 | Upper Volume |
| 7100 | Lower Volume |
| 7110 | Pin Hole (Through Hole) |
| 7120 | Lift Pin |
| 7130 | Movable Pin Plate |
| D | Pin Height Dimension |
| 8000 | Outer Wall Assembly |
| 8010 | Outer Aperture |
| 8020 | Second Outer Aperture |
| 8030 | Right Side Wall |
| 8040 | Left Side Wall |
| 8050 | Top Wall |

-continued

| List of Item Reference Numbers | |
|---|---|
| 8060 | Bottom Wall |
| 8100 | Third Reaction Chamber |
| 8110 | Removable Liner |
| 8120 | Substrate Tray |
| 8130 | Tray supports |
| 8140 | Reaction Chamber |
| 8150 | Overhanging (Substrate) Edge |
| 8160 | Input plenum |
| 8170 | Exit Plenum |
| 8180 | Outer wall assembly |
| 8190 | Heating element |
| 8200 | Electrical Connector |
| 9005 | Gas Fittings |
| 9010 | Input Port |
| 9015 | Outer Tube |
| 9020 | |
| 9030 | Input Port Flange |
| 9040 | Screws |
| 9050 | |
| 9060 | Precursor Tube |
| 9070 | Annular Flange |
| 9080 | Front Edge |
| 10030 | |
| 10040 | Triangular Input Plenum |
| 10050 | Trapezoidal Exit Plenum |
| 10060 | Upper Wall Portion |
| 10070 | Lower Wall Portion |
| 10080 | Lower Wall Portion |
| 10090 | Triangular Vertical Wall |
| 10100 | Trapezoidal Vertical Wall |
| 10110 | Front Vertical Flow Channel |
| 10120 | Back Vertical Flow Channel |

SUMMARY OF THE INVENTION

The present invention provides a reaction chamber assembly suitable for forming thin film deposition layers onto solid substrates. The reaction chamber assembly of the present invention is improved over conventional reaction chamber assemblies by delivering a substantially uniform flow of source material into a reaction chamber across the entire width or length of the substrates supported inside the reaction chamber for coating. The reaction chamber assembly of the present invention further improves over conventional reaction chamber assemblies by causing the flow of source material to flow over the substrates being coated with a substantially uniform flow direction and velocity. The reaction chamber assembly of the present invention further improves over conventional reaction chamber assemblies by reducing eddy currents in the flow of source materials. The reaction chamber assembly of the present invention further improves over conventional reaction chamber assemblies by compressing outflow gasses in an output plenum to increase flow velocity proximate to an exit port. The configuration of gas flow conduits and the substrate support area reduces pump down time and eddy currents.

The reaction chamber assembly includes a gas tight reaction chamber for enclosing one or more substrates inside for deposition coating. A source module is provided for delivering a flow of source material into the reaction chamber. The source material may include gases, aerosols, vapors or the like held in individual containers. The source material may comprise a single source material or a plurality of source materials flowing in the same flow of source material. The configuration of the reaction chamber assembly is particularly suitable for thin film deposition processes that rely on self-limiting reactions between the source materials and the substrates, e.g. ALE and ALD.

The reaction chamber includes a substrate support area for supporting one or more substrates in a flow of source material. The support area may include an input side and an output side with a flow of the source material flowing over the one or more substrates in a flow direction extending from the input side to the output side. The support area typically includes horizontal support trays with one or more rectangular substrates supported on each tray. The support trays have a support width that is typically slightly larger than a dimension of a substrate supported on the tray. The support width may correspond with a width or a length of a substrate being supported by the substrate support tray.

An input plenum enclosing an input plenum conduit is positioned between the source module and the reaction chamber to receive the flow of source material into an input plenum conduit first end and to deliver the flow of source material into the reaction chamber or an input area of the reaction chamber through an aperture formed by an opposing input plenum conduit second end. The input plenum conduit is shaped to substantially continuously expand in volume from the input plenum conduit first end to the input plenum conduit second end, to expand the volume of the source material and reduce its flow velocity before the source material reaches the reaction chamber. The input plenum conduit has a first cross section and a substantially orthogonal second cross section and the first cross section may be triangular to continuously expand in volume from the input plenum conduit first end to the input plenum conduit second end. Preferably, the input plenum conduit second end forms an aperture that has an aperture width that is substantially equal to or greater than the support width to distribute source material over the entire support width before the source material is delivered into the reaction chamber or into an input area of the reaction chamber but before the source material reaches the substrate support area to ensure that the entire support width is exposed to the flow of source material.

The input plenum may be disposed outside the reaction chamber such as attached to a side wall of the reaction chamber assembly or the input plenum may be disposed inside the reaction chamber e.g. vertically below the reaction chamber in the same footprint as the reaction chamber to reduce a floor space footprint of the reaction chamber assembly. The second input conduit cross section may also be configured to expand in volume from the input plenum conduit first end to the input plenum conduit second end such that the input conduit second end is formed with an input aperture height substantially equal to a support height of the substrate support area. The second input conduit cross section may be triangular.

The reaction chamber assembly includes a vacuum pump or other vacuum source in fluidic communication with the reaction chamber for removing an outflow from the reaction chamber as well as for pumping the reaction chamber down to a desired vacuum pressure. An output plenum enclosing an output plenum conduit is disposed between the reaction chamber and the vacuum pump and the vacuum pump draws the outflow material out of the output plenum conduit through an exit port. The output plenum conduit has an output plenum first end in fluidic communication with the vacuum pump and an opposing output plenum conduit second end positioned to draw the outflow from an output side of the substrate support area or from the reaction chamber. The output plenum conduit is shaped to substantially continuously decrease in volume from the output plenum conduit first end to the output plenum conduit second end.

The output plenum conduit is formed with a first output plenum conduit cross section and an orthogonal second output plenum conduit cross section. The first output plenum conduit cross section may be triangular or trapezoidal and continuously decreases in volume from the output plenum conduit second end to the output plenum conduit first end. The output plenum conduit second end forms an aperture having an aperture width that is substantially equal to or greater than the support width. The second output plenum conduit cross section may also be configured to expand in volume from the output plenum first end to the output plenum second end and the second end may form an aperture with an aperture height equal to or greater than a substrate support area height to uniformly draw the outflow materials from the entire height of the substrate support area. The output plenum may be disposed outside the reaction chamber or the output plenum may be disposed inside the reaction chamber assembly e.g. vertically below the reaction chamber in the same area footprint of the reaction chamber to reduce the overall floor space footprint or the reaction chamber assembly. The second output conduit cross section is may be triangular.

The reaction chamber assembly may be formed by an outer wall assembly for enclosing an outer volume. An outer aperture passes through one of the outer walls to the outer volume to provide access for loading a removable and cleanable liner into the outer volume through the outer aperture. The outer aperture may be in a front or a back outer wall. The removable liner encloses the reaction chamber and is configured to provide the substrate support area therein. The removable liner includes liner walls and a chamber aperture passing through a front wall of the liner walls to provide access to the substrate support area through the chamber aperture. The removable liner is configured to be installed into and removed from the outer volume through the front or a back outer aperture. An access door is disposed on a front wall of the reaction chamber assembly and movable from an open position, to expose the chamber aperture for loading and unloading substrates into the substrate support area through the front wall, or to a closed position for substantially gas sealing the chamber aperture with a chamber aperture seal element attached to the access door. The access door includes sealing elements for sealing the outer volume and the reaction chamber when the door is closed. A back panel and sealing elements may be provided to gas seal the back outer aperture. The input and output plenums may be disposed inside the removable liner. The input and output plenums may also include internal plenum baffles disposed inside the plenum conduits for directing the flow along desired flow paths inside the plenum conduits. The plenum baffles are disposed to increase the uniformity of the flow of source material across the input conduit aperture width.

The present invention further provides improved methods for depositing thin film layers of solid material onto exposed surfaces of a substrate housed inside the reaction chamber by supporting the substrate on a horizontally disposed substrate tray with a surface being coated facing vertically upward. The substrate tray or trays have a width equal to or slightly larger than the substrate area support width. The reaction chamber assembly is configured to receive a flow of source material from the source into a first end of an input plenum conduit that is disposed between the source and the reaction chamber. The input plenum conduit is shaped with a first cross section formed to expand the volume of the flow of source material as it flow through the input plenum conduit. The input conduit receives the flow of source material from the source at a first input plenum conduit end and delivers the expanded flow of source material out of a second input conduit end into the reaction chamber. The second input conduit end forms an aperture that delivers the flow of source material into the reaction chamber over the entire support width.

The method further includes the steps of operating a vacuum pump or other vacuum source to remove an outflow of material from the reaction chamber and the outflow material is removed from the reaction chamber through an output plenum conduit disposed between the reaction chamber and the vacuum pump. A second end of the output plenum conduit is formed to remove the outflow of material over the entire support width. The output plenum conduit is further formed to compress a volume of the outflow material in a first cross section of the output plenum conduit. Outflow material is removed from the reaction chamber across the entire support width by an aperture formed by a second end of the output plenum conduit and the aperture has an aperture width that is equal to or wider than the substrate support width.

The method further includes disposing a plurality of substrate support trays horizontally one above another with an open volume provided between substrate trays for the flow of source material to flow through. The support trays and open volume have a combined support height and the method further includes the step of expanding the volume of the flow of source material in a second cross section of the input plenum conduit to deliver the expanded flow of source material from a second end of the input plenum conduit into the reaction chamber over the entire support height. The method further includes removing the outflow of material from the reaction chamber over the entire support height and compressing the volume of the outflow material in a second cross section of the output plenum conduit. The expanded flow of source material delivered from a second end of the input plenum conduit may also be delivered into a front vertical flow channel of the reaction chamber and the outflow material may be removed from a back vertical flow channel of the reaction chamber. The method may include disposing each of the input plenum conduit and the output plenum conduit vertically below and in the same area footprint as the reaction chamber or disposing each of the input plenum conduit and the output plenum conduit external to the reaction chamber attached to opposing side walls of a reaction chamber assembly. In addition, an input plenum and an output plenum may be configuring to mount on opposing sidewalls of the reaction chamber assembly and the position of the input and output plenums may be interchangeable to reverse the flow in the reaction chamber. These and other aspects and advantages will become apparent when the Description below is read in conjunction with the accompanying Drawings.

BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 1 depicts an isometric view of a first exemplary improved ALD system configured with a chamber housed within a system cabinet and with a chamber door shown in a closed position according to one aspect of the present invention.

FIG. 2 depicts an isometric view of an improved ALD system configured with a chamber housed within a system cabinet and with a chamber door shown in an open position according to one aspect of the present invention.

DESCRIPTION OF THE PREFERRED EMBODIMENTS

ALD System First Embodiment

Figure 3:
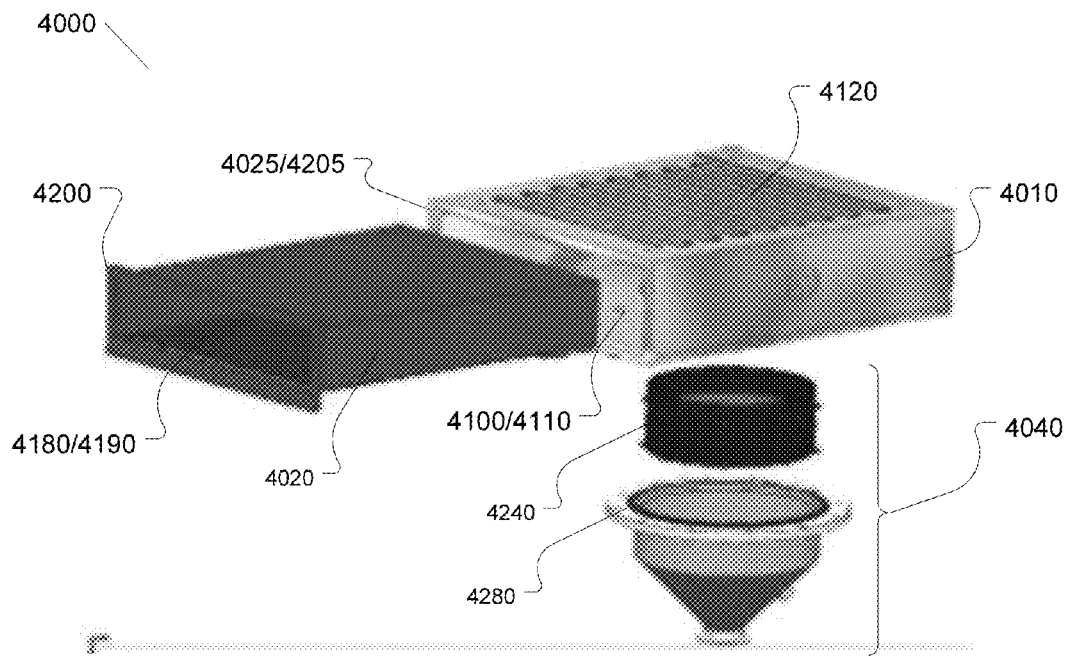
FIG. 3 depicts an exploded isometric view of an ALD reaction chamber configured with a removable liner according to an embodiment of the present invention.
Figure 4:
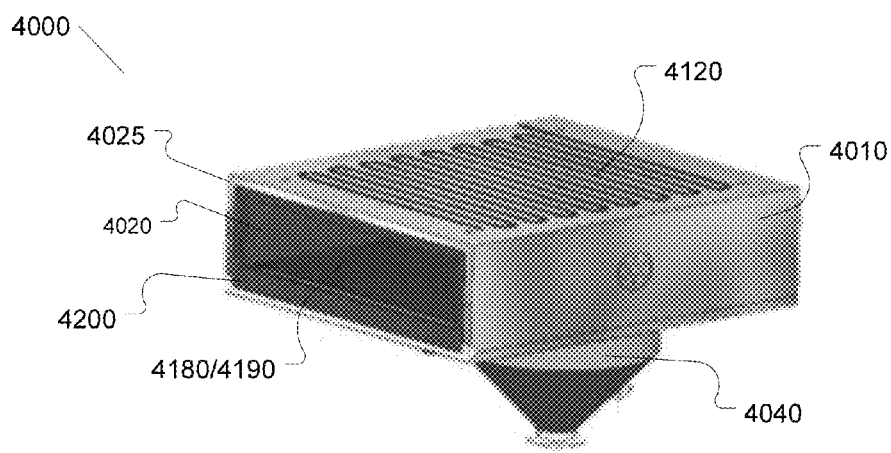
FIG. 4 depicts an isometric view of an assembled ALD reaction chamber configured with a removable liner according to an embodiment of the present invention.

Referring to FIGS. 1 and 2, an exemplary first embodiment of an atomic layer deposition system (ALD) (2000) configured according to the present invention is constructed with a floor standing system cabinet (2010) supported on four feet (2020) having a front face (2030) that includes an access door assembly (2040). The access door assembly (2040) includes a door handle (2050) mounted on an outer door panel (2060). Both the outer door panel (2060) and the door handle (2050) are thermally insulated to protect an operator when handling the door handle (2050). The access door assembly (2040) is shown in a closed or operating position in FIG. 1 and in an open or loading/unloading position in FIG. 2. The access door assembly (2040) provides access through the system cabinet (2010) to a gas deposition or reaction chamber (4000) described below. The gas deposition chamber (4000) is housed inside the system cabinet (2010) behind the access door assembly (2040). A gas supply system, vacuum pump and related plumbing, as well as a system electronic controller are housed inside the floor standing cabinet (2010), below the reaction chamber (4000). An exemplary gas supply system, vacuum pump, related pluming and control elements usable with the present invention are described by Monsma et al. in co-assigned and co-pending U.S. Pat. App. Pub. US2006/0021573 entitled VAPOR DEPOSITION SYSTEM AND METHODS, which is incorporated herein by reference in its entirety. In the first example ALD system shown in FIGS. 1 and 2, the gas deposition chamber (4000) is configured to coat solid substrates using ALD and other self limiting thin film deposition process coating cycles and the access door assembly (2040) provides the only access to the gas deposition chamber (4000) for installing and removing substrates being coated. Accordingly, substrates to be coated are loaded into the gas deposition chamber (4000) and removed from the gas deposition chamber (4000) after coating through the access door assembly (2040). As will be recognized, the present invention is not limited to ALD coating cycles but can be used for other thin film deposition coating techniques in various reaction chamber environments. However, the exemplary reaction chamber assembly embodiments described herein are particularly configured to operate in a mode that introduces reactants or precursors into the reaction chamber one at a time and the reaction between substrate surfaces and a single precursor are substantially self-limiting. An advantage of each of the exemplary embodiments of the present invention is that they do not include a showerhead or other small nozzle elements used as gas distribution elements which may become clogged by thin film deposition layers built up by continued exposure to precursors during many thin film deposition cycles. An advantage of the first exemplary embodiment is that is has a small floor space footprint. The small footprint is due in part to the position of input and output plenums used to deliver and remove reactant gases to and from the reaction chamber. In particular, as will be described below, the input and output plenums are incorporated within the reaction chamber volume and therefore do not increase the floor space footprint of the ALD system (2000).

Reaction Chamber

Referring now to FIGS. 3-6 a first example gas deposition chamber or reaction chamber assembly (4000) according to the first embodiment of the present invention includes an outer wall assembly (4010), a removable liner (4020), an input port assembly (4030) for delivering gas reactants into the reaction chamber through an input plenum and an exit port assembly (4040) for removing gases from the reaction chamber through an output plenum. As shown in the section views of FIGS. 5 and 6, the outer wall assembly (4010) comprises a rectangular shell structure formed by opposing and substantially parallel top and bottom rectangular outer walls (4050) and (4060), opposing and substantially parallel rectangular side outer walls (4070) and (4080) and opposing and substantially parallel rectangular front and back outer walls (4090) and (4095). The rectangular shell structure of the outer wall assembly (4010) encloses an outer volume (4110) which has a front-to-back longitudinal length and a side-to-side transverse width in a horizontal plane and a vertical height. The longitudinal length is shown in the side view of FIG. 5 and the transverse width is shown in the back cutaway view of FIG. 6 with the vertical height shown in both figures. An outer aperture (4100), shown in FIG. 3, passes through the front outer wall (4095) to the outer volume (4110). In the present example, the outer volume has a rectangular cross-section in the horizontal and vertical planes and the outer aperture (4100) is rectangular in the vertical plane with a transverse width and a vertical height dimension substantially matched to the transverse width and vertical height dimensions of the outer volume (4110). More generally, the outer walls may have various shapes and sizes to enclose an outer volume of a desired shape and size without deviating from the present invention. Moreover, the outer aperture (4100) may be formed with various shapes and sizes and extend through any one of the side, top or bottom outer walls to provide access to the outer volume as required by the application. In particular, various outer wall configurations can be used to enclose an outer volume with various polygon or circular shaped cross-sections without deviating from the present invention.

Generally, the outer wall assembly (4010) comprises an oven structure that includes or may include resistive heating elements, or the like, (4120) disposed on or in grooves formed in external surfaces of all or some of the outer walls (4050-4095). Alternately, according to an advantage of the present invention, the heating elements (4120) may be disposed on or in grooves formed on internal surfaces of some or all of the outer walls because the removable liner described below prevents the internal surfaces of the outer walls and any heating elements disposed thereon from being contaminated by reactants. Otherwise, the heating elements (4120) can be disposed inside some or all of the outer walls (4050-4095) such as by being sandwiched between opposing outer wall portions. The heating elements (4120) heat the chamber assembly (4000) to a deposition or reaction temperature and maintain the chamber assembly at the desired temperature over prolonged periods of use. In addition, solid substrates that are being coated in the reaction chamber are also heated to the reaction temperature and the solid substrates may be heated before being inserted into the reaction chamber to reduce the cycle time required to heat the solid substrates to the reaction temperature. Accordingly, the chamber assembly (4000) includes temperature sensors and one or more controllers for controlling the operation of the heating elements to achieve and maintain desired operating temperatures. Alternately, other heating means including heating elements disposed external to the outer wall assembly (4010) are usable without deviating from the present invention. In still further embodiments, the chamber assembly (4000) may not require heating elements or may instead include cooling elements to achieve desired reaction temperatures.

When heating elements are disposed outside the outer volume (4110) it is desirable to direct thermal energy into the outer volume (4110). Accordingly, the outer walls (4050-4095) preferably comprise a material having a high thermal conductivity in order to provide a conductive path between the heating elements (4120) and the outer volume (4110). In addition, it is desirable that the outer wall material meet its structural and thermal property characteristics over the range of operating temperatures that the chamber assembly (4000) is expected to be subjected to.

Ideally, the outer wall assembly (4110) comprises a substantially gas tight structure when the access door (2040) is in a closed position. In particular, the outer volume (4110) may be pumped to vacuum pressures ranging down to about 10 microtorr to remove contaminants, reactants, and reactant byproducts from the chamber assembly and to maintain the reaction chamber at a vacuum pressure that is suitable for the desired reactions and deposition result. Accordingly, it is desirable to join the outer walls (4050-4095) with welded seams to prevent gas leaks and to configure any ports and fittings associated with the ports that pass through the outer walls (4050-4095) with gas tight gaskets and the like as are generally used in vacuum chambers.

In the present example, the preferred material for constructing the outer walls (4050-4095) is aluminum and particularly 6061 aluminum, which has good weldability, an acceptable thermal conductivity of approximately 167 W/m-K or 1160 BTU-in/hr-ft$^2$-° F., and a melting temperature of approximately 600° C. or 1150° F. Alternately, any weldable aluminum and other weldable metals can be used without deviating from the present invention. Preferably, the outer walls (4050-4095) comprise sheet or plate stock, folded, formed, machined, welded and fastened together as required to enclose the outer volume (4110) with gas tight seams and to provide the desired structural and thermal performance characteristics. Moreover, one or more of the outer walls (4050-4095) may be made thicker than required to perform structurally in order to provide a heat sink suitable for maintaining the outer wall assembly (4010) at a desired operating temperature and allow quick reheating, e.g. after the access door has been opened and new substrates have been installed into the reaction chamber for coating. In the preferred embodiment, a layer of thermal insulation is disposed over the external surfaces of the outer walls (4050-4095) to reduce thermal radiation to the air surrounding the outer wall assembly (4010).

Removable Liner

Referring to FIGS. 3-6, the reaction chamber (4000) further comprises a removable liner (4020). The removable liner (4020) comprises a shell structure sized to fit into the outer wall assembly (4010) when installed through the outer aperture (4100). The liner (4020) is configured to line the inside surfaces of the outer walls and specifically the top and bottom outer walls (4050, 4060), the side outer walls (4070, 4080) and the back outer wall (4090). In the example first embodiment of the present invention the removable liner (4020) comprises opposing and substantially parallel top and bottom rectangular liner walls (4130, 4140), opposing and substantially parallel side rectangular liner walls (4150, 4160) and a rectangular back liner wall (4170), shown in FIG. 5. The removable liner (4020) encloses a reaction chamber or inner volume (4190), which has a front-to-back longitudinal length and a side-to-side transverse width in a horizontal plane and a vertical height. The removable liner further includes a chamber aperture (4180) passing through one of the liner walls to provide access to the reaction chamber (4190). In the present example the reaction chamber (4190) has a rectangular cross-section in the horizontal and vertical planes and the chamber aperture (4180) is substantially rectangular in the vertical plane with a transverse width and vertical height dimension substantially matched to the transverse width and vertical height dimensions of the reaction chamber (4190). As best viewed in FIGS. 3 and 4, the chamber aperture (4180) faces front in the reaction chamber assembly and is substantially centered in the outer aperture (4100) such that the outer aperture (4100) receives the removable liner (4020) into the outer volume (4110) and the chamber aperture (4180) receives substrates to be coated into the reaction chamber (4190).

The removable liner (4020) also includes a rectangular flange (4200) surrounding the chamber aperture (4180) and the flange substantially forms a front face to the removable liner (4020). The flange (4200) stiffens the removable liner (4020) to prevent buckling and distortion of the liner and the chamber aperture. The flange (4200) contacts the front outer wall (4095) when the removable liner is installed into the outer wall assembly (4010). The front outer face (4095) includes a rectangular recess (4205) surrounding the outer aperture (4100) for receiving the rectangular flange (4200) therein. In the installed position, an inside surface of the flange (4200) is in mating contact with a bottom of the rectangular recess (4205) and an outside surface of the flange (4200) is flush with the outside surface of the front outer wall (4095).

In its operating position, the removable liner (4020) makes mating contact with several surfaces of the outer wall assembly (4010). Ideally, the removable liner (4020) is sized to exactly mate with all or most internal surfaces of the outer rectangular volume (4110) such that an uninterrupted thermal conduction path extends from the heating elements (4120) to surfaces of the removable liner (4020) and to substrate trays (described below) supported by the removable liner (4020). However, exact mating over all surfaces is not practical so the removable liner (4020) and or outer wall assembly (4010) may be configured with contacting surface features e.g. bumps, ridges, interlocking guides, etc., not shown in the first example embodiment, with sufficient mating contact area provided between the outer walls and the removable liner to readily conduct thermal energy from heating elements to all surfaces of the removable liner. In addition, a thermal conduction pathway is provided at the interface between the rectangular flange portion (4200) and the front face (4025). In areas where mating contact between the outer walls and the removable liner, a clearance gap volume, e.g. the clearance gap volume (4215) shown in FIG. 6, between external surfaces of the liner walls (4130-4170) and internal surfaces of the outer walls (4050-4090) forms a free volume and, as will be described below, the free volume is continuously purged with an inert gas to prevent reactants from reacting with the internal walls of the outside wall assembly (4010).

The removable liner (4020) and the outer wall assembly (4010) may be mechanically interlocked such as by sliding interlocking features e.g. by a rod or bar guided in a slot or by a dovetail bar guided in a mating dovetail slot or the like. With one half of the interlocking feature on the removable liner (4020) and the other half on the outer wall assembly (4010), the interlocking features serve to align and guide the removable liner (4020) into and out of its desired operating position and may increase thermal conduction by increasing the area of mating contact between the liner and outer walls. In a preferred embodiment, the removable liner (4020) is mechanically held in place by its engagement or mating contact with the outer wall assembly (4010). Accordingly, the removable liner (4020) is held in place without fasteners. This provides an advantage that a contaminated liner can be removed and replaced with a clean liner quickly and without tools. This further eliminates the problem of dealing with reactant build up on fasteners, which may render the fasteners unusable. Alternately, fasteners can be used to fasten the flange portion (4200) to the front outer wall (4095).

In a preferred embodiment, the removable liner (4020) comprises a material that can be cleaned to remove reactant contaminants from its surfaces and be reused in the reaction chamber assembly; however, disposable liners also can be used and are within the scope of the present invention. In addition, it is desirable that the liner material meet its structural and thermal property characteristics over the range of operating temperatures that the chamber assembly (4000) is expected to be subjected to. Additionally the liner material should have good resistance to breakdown and or other detrimental reactions with reactants and other materials such as reactant byproducts that the chamber assembly (4000) is expected to be subjected to. In addition, since the liner is periodically removed and replaced, it is desirable to keep the weight of the liner low.

It is desirable to clean liners removed from the reaction chamber assembly to remove contaminants therefrom. Solid film layers deposited onto the removable liner by reactions with reactants or precursors are removed primarily by abrasive blasting, e.g. sand, shot or bead blasting and the preferred liner material should be able to withstand repeated abrasive blasting. Otherwise, the solid film layers and other contaminants built up on the liner over prolonged use can be removed by chemical methods such by an acid etching or using solvents or the like. In other cases, the liner may become contaminated by an undesirable reactant or reaction byproduct and need to be replaced immediately for safety reasons, and it is desirable to reuse the contaminated liner after cleaning by abrasive blasting or chemical cleaning.

The removable liner comprises thin single layer sheet metal walls comprising stainless steel ranging in thickness from 0.5-2.0 mm thick (0.02-0.80 inch). The stainless steel is readily cleanable by a bead blast using 180-grit glass or ceramic beads after a high-pressure hot deionizer water wash. In particular, the stainless steel has a Brinnell Hardness of approximately HB 200, which is high enough to be subjected to repeated bead blasting. Otherwise, the stainless steel liner is readily cleanable by a hydrofluoric acid in a liquid bath or vapor chamber. Additionally the stainless steel liner meets the thermal and structural requirements.

Preferably, the removable liner (4020) is formed as a unitary element such as by cold forming or deep drawing the liner from a preformed blank. Otherwise the liner is formable by various know sheet metal forming methods. Ideally, the removable liner forms a gas tight reaction chamber (4190) with gas tight, e.g. welded seams and gas sealed fitting interface apertures that prevent reaction gases from reaching the outer wall assembly (4010). However, in practical embodiments, some leakage through the removable liner (4020) into the clearance gap volume (4215) between the removable liner (4120) and the outer wall assembly (4010) is expected. Accordingly, a pressure gradient may be established between the clearance gap volume and the reaction chamber by purging the clearance gap volume (4215) with an inert gas provided at a gas pressure that is higher than the gas pressure inside the reaction chamber, e.g. the inert gas inside the clearance gap volume may be maintained at atmospheric pressure or greater.

Pressurized Clearance Gap

Figure 6:
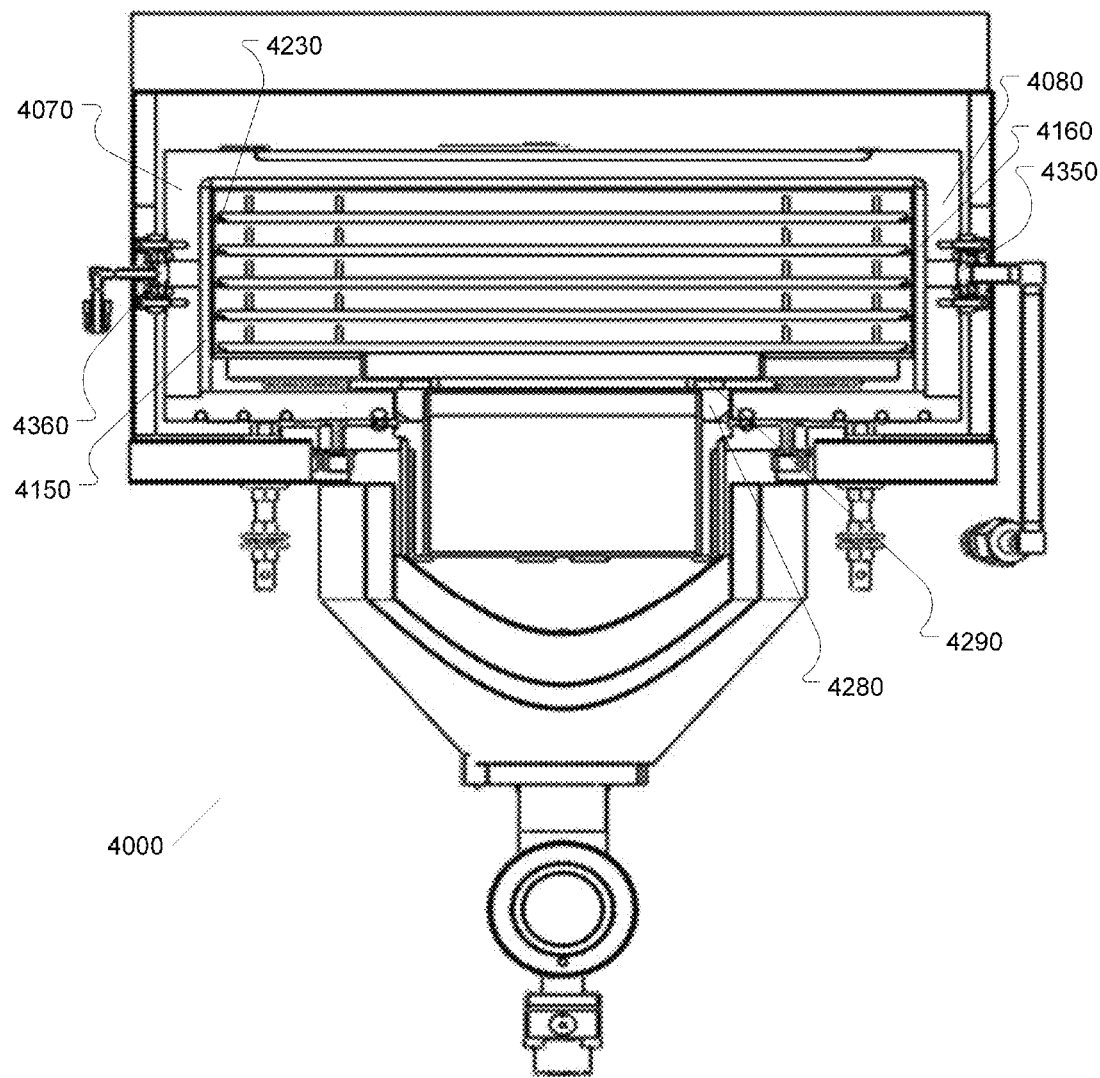
FIG. 6 depicts a rear section view taken through an exemplary improved ALD reaction chamber configured with a removable liner and a purge gas input port for delivering purge gas to a small clearance gap formed between the removable liner and an outer wall assembly of an exemplary improved ALD reaction chamber according to an embodiment of the present invention.

Referring now to FIG. 6, the clearance gap volume (4215) is purged with inert gas through a gas input port (4350). The port (4350) installs through the side outer wall (4080) and is in fluidic communication with a gas supply container to deliver an inert purge gas into the clearance gap volume (4215) surrounding the removable liner (4020). Preferably, the purge gas is nitrogen. Purge gas is substantially constantly delivered into the clearance gap volume (4215), preferably at atmospheric pressure or greater. A gas output port (4360) passing through the side outer wall (4070) is in fluidic communication with clearance gap volume (4215). The output port (4360) includes a pressure relief valve, not shown, set to relieve excess pressure in clearance gap volume (4215) if the pressure therein exceeds a preset pressure limit. The preferred pressure in the clearance gap volume (4215) exceeds the pressure in the reaction chamber to create a pressure gradient that substantially prevents gas in the reaction chamber (4190) from leaking into the clearance gap volume (4215). The continuous flow of inert gas flowing into the clearance gap volume (4215) through the port (4350) fills the clearance gap volume (4215) and then leaks into the reaction chamber through any leaks in the removable liner (4020) and associated ports passing there through. The inert gas leaked into the reaction chamber is exhausted out of the reaction chamber through the exhaust port described below. The gas pressure in the clearance gap volume (4215) is maintained at about 1-5 pounds per square inch above atmospheric pressure. Any higher gas pressures will cause the relief valve to open to reduce the pressure inside the clearance gap volume (4215) and exhaust gas out of the clearance gap volume (4215) through the port (4360). In other embodiments, one or both of the ports (4350) and (4360) may be in fluidic communication with the reaction chamber exit port assembly (4040) or another conduit in fluidic communication with the system vacuum pump described below to evacuate the clearance gap volume (4215) and maintain the gas pressure in the clearance gap volume (4215) at less than atmospheric pressure but still at a higher pressure than is maintained inside the reaction chamber (4190).

Access Door

Figure 5:
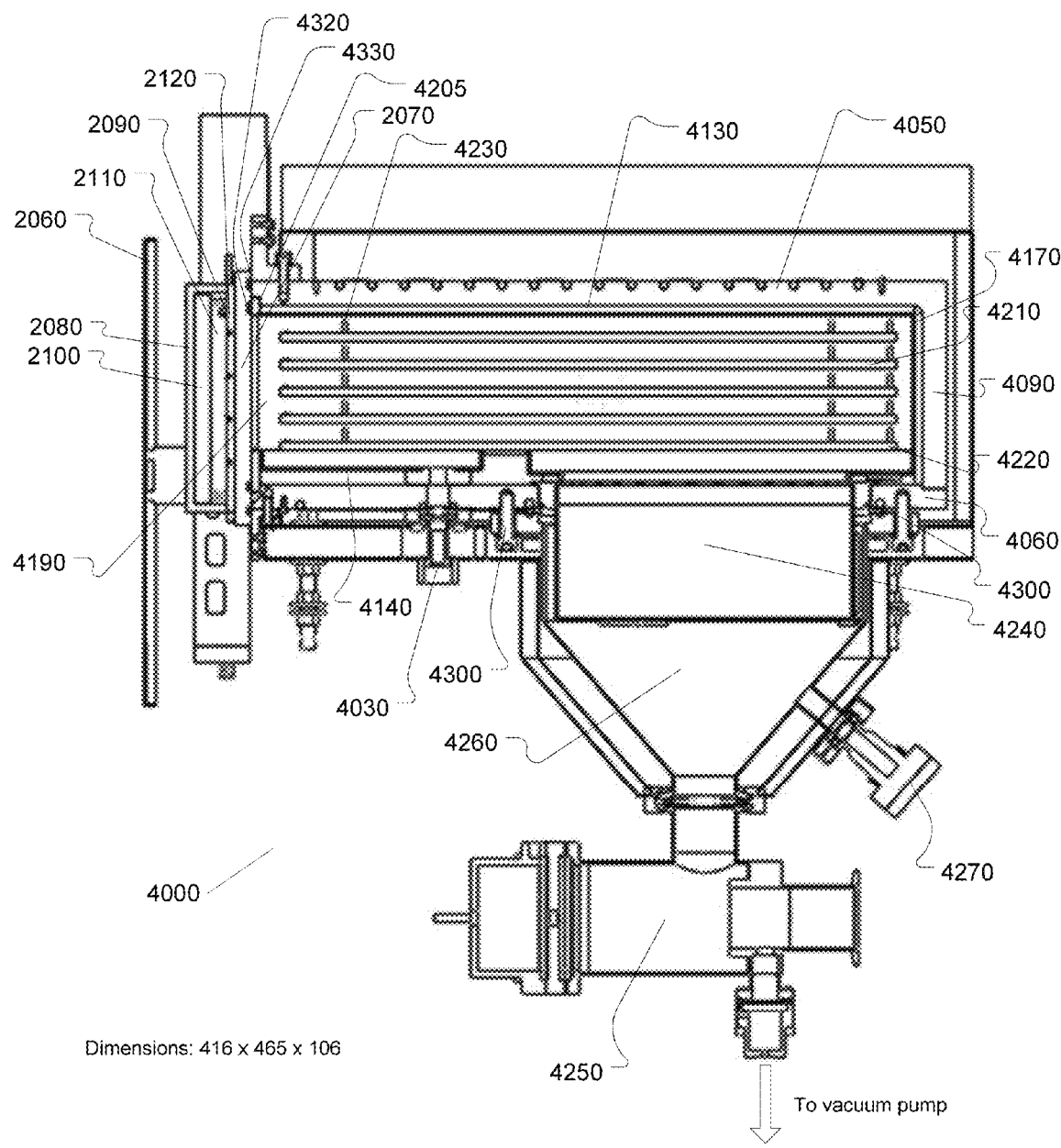
FIG. 5 depicts a side section view taken through an exemplary improved ALD reaction chamber configured with a removable liner and five substrate trays according to an embodiment of the present invention.

Referring to FIG. 5, the access door assembly (2040) is shown in side view in the closed position. The access door assembly (2040) includes the outer door panel (2060), the door handle (2050), an inner door panel (2070), a door cover (2080), a door heating element (2090), disposed between the inner door panel (2070) and a thermal insulation layer (2100) disposed between the door heating element (2090) and the door cover (2080). The inner door panel (2070) has rectangular dimensions that exceed the rectangular dimension of the outer aperture (4100) passing through the front outer wall (4095) and includes an outer rectangular o-ring seal (4330) positioned to seal the outer aperture (4100) when the access door is closed. In the present embodiment, the entire access door assembly (2040) is supported on one or more vertically disposed rails or rods, not shown, to move the door assembly vertically upward or downward to an open position to allow access to the reaction chamber (4190) through the outer aperture (4100) passing through the outer wall assembly and through the chamber aperture (4180) passing through the removable liner. In the closed position, shown in FIG. 5, the inner door panel seals both the outer aperture (4100) with the first rectangular o-ring seal (4320) and the chamber aperture (4180) with a second rectangular o-ring seal (4330). Each of the o-ring seals (4320) and (4330) has a closed rectangular form that fits into a matching rectangular groove formed on the inner door panel (2070) facing the reaction chamber. The o-ring seals may have a circular or square cross-section and may comprise a material suitable for the sealing application, e.g. temperature and pressure.

The heating assembly (2090) includes a rectangular aluminum plate (2110) approximately matching the rectangular dimensions of the inner door panel (2070) and mounted in mating contact therewith. A resistive heating element (2120) is mounted in mating contact with the rectangular aluminum plate (2110) opposed to the inner door panel (2070) such that thermal energy generated by the heating element (2120) is conducted through the rectangular aluminum plate (2110) and through the stainless steel inner door panel (2070) to radiate into the reaction chamber (4190). The insulation layer (2100) is rectangular and approximately matches the dimensions of the aluminum plate (2110) and is mounted in contact with the heating assembly (2090) opposed to the inner door panel (2070). The door cover (2080) is attached to the aluminum plate (2110) and holds the insulation layer (2100) in place.

According to a further aspect of the present invention, the stainless steel inner door panel (2070) is removable from the access door assembly (2040) for periodic cleaning and replacement. In particular, the inner door panel (2070) is removed when the removable liner (4020) is removed for cleaning and both the removable liner (4020) and the inner door panel (2070) are cleaned simultaneously. Alternately, either of the inner door panel or removable liner may be disposed of and replaced with new elements. The cleanable inner door panel (2070) is fabricated from stainless steel so that it can be cleaned using bead blasting or a chemical method as described above in relation to cleaning the removable liner. Preferably, the inner door panel (2070) is attached without fasteners or at least without fasteners that are exposed to the reaction chamber (4190). The inner door panel (2070) may be clamped or held in place by interlocking features located between the inner door panel (2070) and the aluminum plate (2110).

Substrate Support

Figure 7:
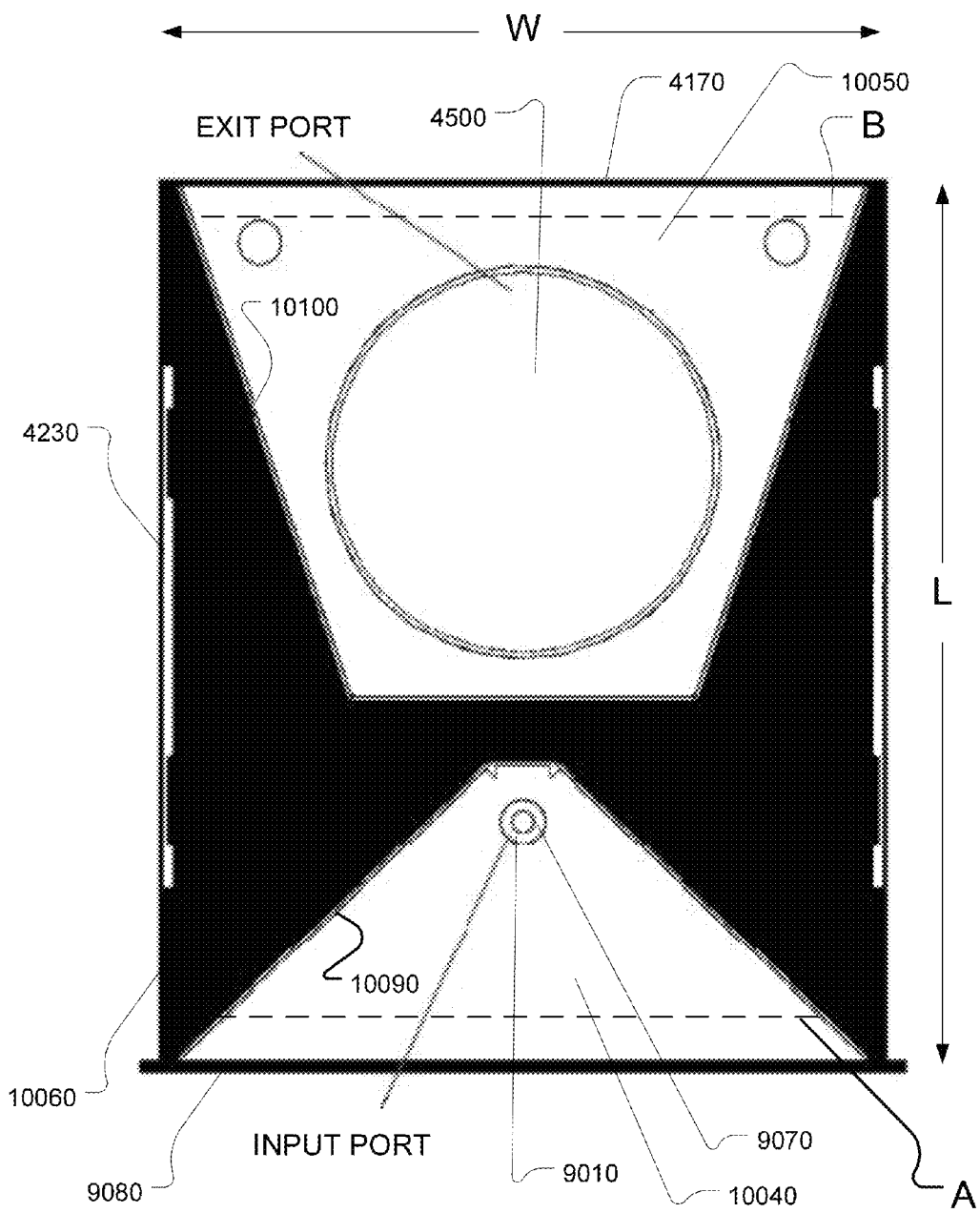
FIG. 7 depicts a top section view taken through a removable liner depicting a reaction chamber input aperture proximate to the apex of a triangular plenum and a larger reaction chamber exit aperture proximate to the narrow end of a trapezoidal plenum according to an embodiment of the present invention.
Figure 8:
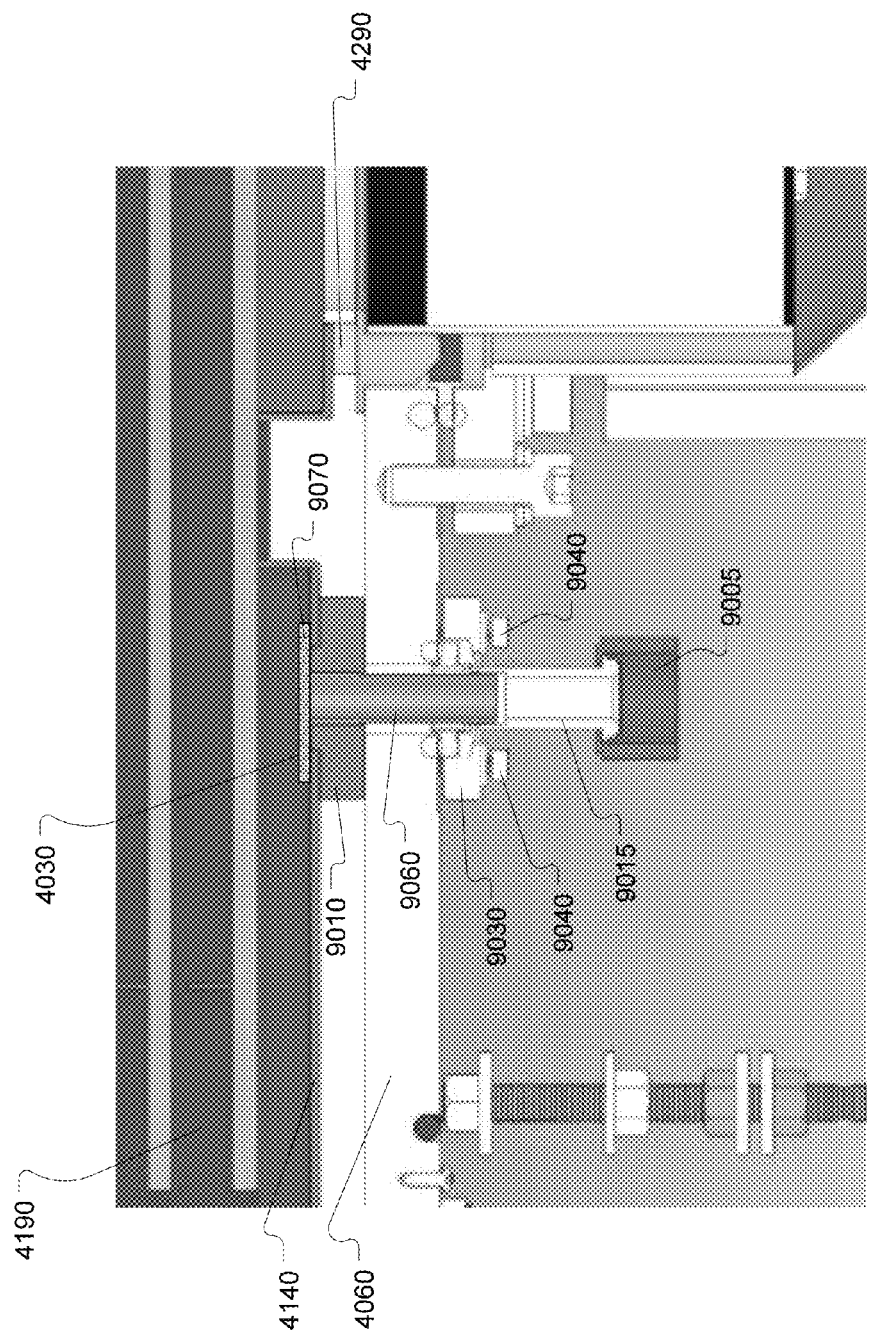
FIG. 8 depicts a side section taken through an improved ALD reaction chamber input port assembly according to an embodiment of the present invention.
Figure 9:
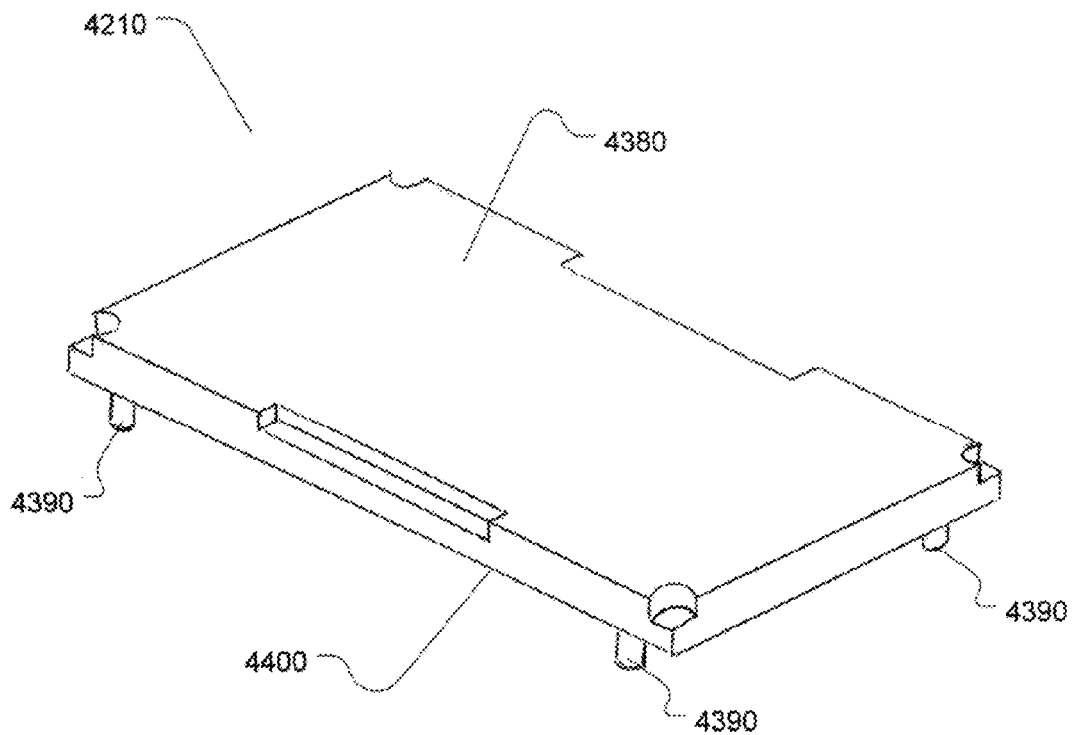
FIG. 9 depicts an isometric view of a substrate tray suitable for supporting substrates inside a removable liner installed into an improved ALD reaction chamber according to an embodiment of the present invention.

Referring now to FIGS. 5-9 the reaction chamber (4190) of the first example embodiment is configured to support a plurality of substrate trays (4210), shown in FIG. 9, on tray supports (4230), shown in FIG. 7. The tray supports (4230) are attached to and extend out from opposing side walls (4150, 4160) of the removable liner (4020) to receive the substrate trays thereon. The substrate trays (4210) may be gravity supported on the tray supports (4230) or may be otherwise fastened or clamped to the side walls (4150, 4160) or supported from the top or bottom liner walls (4130, 4140). Preferably, each substrate tray (4210) is fabricated from ALPASE K100-S which is an aluminum plate material specifically designed for vacuum applications and which possesses desirable characteristics for gas deposition environments such as dimensional stability, excellent machinability, weldability, low stress content, and equiaxial grain structure. Preferably, the tray supports (4230) and substrate trays (4210) provide a thermally conductive path extending from the removable liner (4020) to solid substrates supported on the substrate trays (4210) to reduce the time required to heat substrates to a desired reaction temperature. Aluminum is particularly desirable for the substrate trays (4210) because of its high thermal conductivity (e.g. 812 BTU-in/hr-ft$^2$-° F.) to quickly and uniformly conduct thermal energy to substrates supported thereon, thereby raising the substrate temperature to a desired deposition temperature more quickly than other substrate tray materials. The aluminum substrate trays (4210) described above may not be cleanable by the bead blasting or chemical cleaning processes described above and therefore may be disposed of and replaced with new trays when they become unusable due to material contamination built up by many deposition cycles. Alternately, the substrate trays (4210) can be fabricated from stainless steel so that the trays can be cleaned and reused.

Solid substrates in the form of thin rectangular glass sheets are loaded one on each substrate tray (4210) for ALD or other gas deposition coating. The substrates are only coated on exposed surfaces so the substrate bottom surface is not coated. As shown in FIG. 5 the reaction chamber includes five substrate support trays in the reaction chamber (4190). In the present example embodiment, the longitudinal length and transverse width of the substrate trays (4210) support a GEN 1 rectangular glass plate disposed horizontally thereon. In particular, the GEN 1 substrate has length and width dimensions of 400×300 mm and the example rectangular reaction chamber (4190) has length and width dimensions of 465 mm (18.3 in.) and 416 mm (16.4 in.). Of course larger and smaller reaction chambers with similar characteristics can be constructed to receive larger rectangular glass plates thereon, (e.g. GEN 2-7, or larger) without deviating from the present invention. In addition, the substrate trays (4210) can be removed and other solid substrate types such as batches of circular wafers held in coating cassettes and various other solid substrates standing alone or supported on various substrate holding elements can be loaded into the reaction chamber (4190).

Referring to FIG. 9, a substrate tray (4210) is shown with its bottom surface (4380) facing upward. Each substrate tray may include a plurality of stop pins (4390) or similar alignment aids that extend vertically up from a top surface (4400) or from a side surface of the substrate trays. The stop pins (4390) serve as a guide for aligning edges of substrates supported on the support tray.

In the present example embodiment shown in FIGS. 6 and 7, the reaction chamber (4190) has a vertical height of 106 mm (4.17 in.) and is configured to support five substrate trays (4210) disposed horizontally and substantially evenly spaced apart vertically. According to one aspect of the invention, each of the five substrate trays (4210) is removable from the reaction chamber (4190) through the chamber aperture (4180) and outer aperture (4100) when the access door (2040) is open. Thus the reaction chamber (4190) is operable using any combination of from one to five substrate trays (4210); however, as will be described in detail below, it is preferable to keep a bottom tray (4220) or a suitable substitute for a bottom tray in place for most gas deposition applications.

Input Port Assembly

Referring to FIG. 5, the input port assembly (4030) passes through each of the bottom outer wall (4060) and the bottom liner wall (4140) to deliver reactants into the reaction chamber (4190). Other gases or vapors such as an inert purge gas, carried gas, aerosol or the like may also be delivered into the reaction chamber (4190) through the input port assembly (4030) as required. In a preferred embodiment, the chamber assembly (4000) utilizes a single input port (4030) that is in fluidic communication with an input manifold fluidly connected with a plurality of gas containers and configured to precisely deliver desired volumes or mass flow rates of reactants and other gases into the reaction chamber (4190) according to predefined coating cycle formulas. In addition, the input manifold is preferably configured to deliver a continuous flow of an inert purge gas through the input port, e.g. nitrogen, to continuously purge the input port assembly (4030) to prevent precursors from reacting with surfaces thereof and to ensure that precursors are completely purged from the reaction chamber (4190) during purge cycles. In other embodiments, a plurality of input ports can be used with each input port being in communication with different gas supply containers and preferably with each input port being continuously purged by an inert gas.

FIG. 8 depicts a section view taken through the input port assembly (4030) and the interface of the input port assembly (4030) with the bottom outer wall (4060) and the bottom liner wall (4140). Gasses are delivered into the reaction chamber (4190) through an input port (9010), which passes through the bottom liner wall (4140). A gas fitting (9005) suitable for attaching to an input manifold, not shown, and receiving input gasses therefrom is supported on an outer tube (9015). The outer tube (9015) extends from the gas fitting (9005) and passes substantially through the bottom outer wall (4060). An input port flange (9030) is attached to the bottom outer wall (4060) by screws (9040) and includes a through aperture for receiving the outer tube (9015) there through. A precursor tube (9060) installs into the outer tube (9015) from inside the reaction chamber (4190) formed by the removable liner. In particular, the precursor tube (9060) installs through the input port (9010) and extends from inside the reaction chamber (4190) to fit snugly into the inside diameter of the outer tube (9015). The precursor tube (9060) engages with the outer tube (9015) to a length that extends beyond the bottom outer wall (4060). The precursor tube (9060) has an outside diameter that closely matches the inside diameter of the outer tube (9015) to reduce leakage therebetween. The precursor tube (9060) is withdrawn from the outer tube (9015) in order to remove the removable liner (4020) from the outer wall assembly (4010) and preferably the precursor tube is removable from the outer tube by hand, without using tools.

Exit Port Assembly

Referring to FIG. 5, the exit port assembly (4040) is disposed between and in fluidic communication with the reaction chamber volume (4190) and a vacuum pump or other vacuum source such as a pumped down vacuum tank or the like, not shown. The exit port assembly (4040) includes a trap (4240), a vacuum valve (4250), a cone shaped conduit (4260), disposed between the trap (4240) and the vacuum valve (4250), and a pressure gage (4270) disposed to measure pressure in the cone shaped conduit (4260).

Referring to FIGS. 3, 5, 6, and 7, the cone shaped conduit (4260) includes a cylindrical flange (4280) attached to the bottom outer wall (4060) with attaching screws (4300). The cylindrical flange (4280) supports the entire exit port assembly (4040). An exit port (4500) passes through the bottom liner wall (4140) and fluidly connects with the cone shaped conduit (4260) through a trap seal, (4290). The trap seal (4290) comprises an annular o-ring, e.g. a stainless steel o-ring, positioned between the cylindrical flange (4280) and the bottom liner wall (4140) surrounding the exit port (4500). The trap seal (4290) is attached to the bottom outer wall (4060) and a top surface of the trap seal is positioned to receive the bottom liner wall (4140) thereon when the removable liner is installed into the outer volume.

The trap seal (4290) functions as a gas seal between the removable liner (4020) and the cylindrical flange (4280) to gas seal the interface between the exit port assembly (4370) and the bottom outer wall (4060). The removable liner and trap seal are drawn tightly together in reaction to a pressure drop in the cone shaped conduit generated by the vacuum pump. However even in the event that the trap seal (4290) leaks, the surrounding volume is purged with inert gas at a higher pressure than the gas pressure in side the reaction chamber and cone shaped conduit so that any leakage is substantially inert gas leaking into the reaction chamber so that reactants or precursors are prevented from leaking out. One of the removable liner, cylindrical flange, bottom outer wall or trap seal may include features provided thereon to engage the exit port with the trap seal when the removable liner is installed.

The trap comprises a cylindrical trap (4240) or appropriate filter disposed in the fluid path of gasses drawn out of the reaction chamber (4190) by the vacuum pump. The trap serves to trap, react with, filter or otherwise prevent undesirable materials from exiting from or damaging the gas deposition system, or its components, such as the vacuum pump, valves or piping. The trap (4310) is configured for periodic replacement as required.

Gas Flow Dynamics

Figure 10:
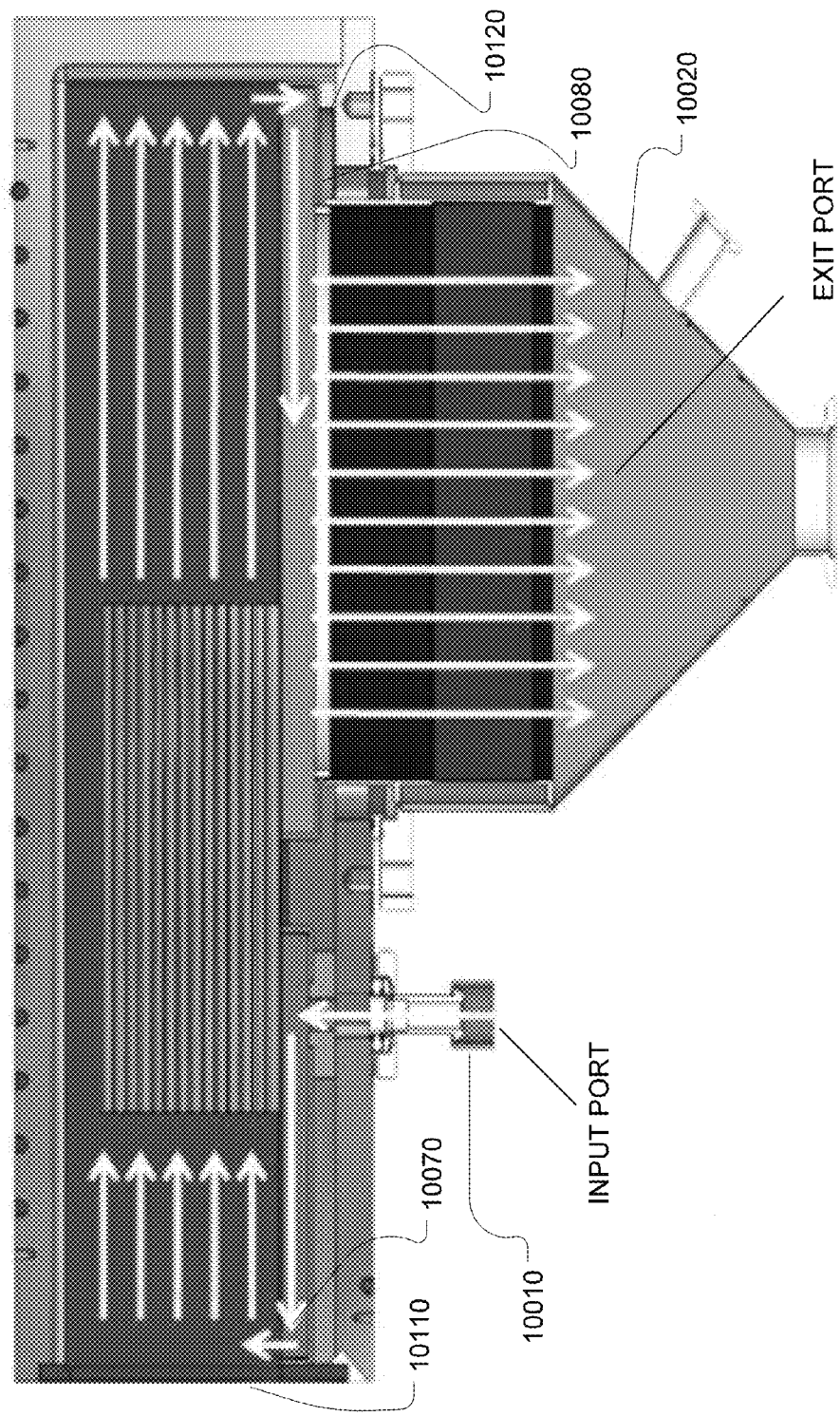
FIG. 10 depicts a side section view of an improved ALD reaction chamber showing the gas flow path from input port to exit port through an exemplary embodiment of the improved ALD reaction chamber according to the present invention.

Referring now to FIGS. 7 and 10 the removable liner (4020) is shown in top section view in FIG. 7, which is substantially a top view of the bottom liner wall (4110). As shown, the input port (9010) comprises a small aperture, e.g. 12 mm (0.47 inch), substantially centered with respect to a transverse width W of the bottom liner wall (4110) and positioned approximately one third of the longitudinal length L away from a front edge (9080) of the bottom liner wall (4110). The input port (9010) is positioned near an apex of a triangular input plenum (10040) with a base of the triangular input plenum open to the reaction chamber. As will be further described below, the bottom liner wall (4110) cooperates with a bottom substrate tray (4220) to substantially enclose a triangular input plenum conduit or volume and the input plenum volume is open to a front region of the reaction chamber over its full transverse width W along a substantially rectangular aperture. In preferred embodiments, the input plenum encloses an input fluid conduit that is shaped in a manner that allows gas entering the input fluid conduit through the input port (9010) at a first or input end of the input fluid conduit to continuously expand in volume as it flows from the input end to a second or output end of the input fluid conduit, which delivers gas from the input plenum conduit into the reaction chamber (4190). Moreover, the shape of the input conduit volume preferably allows input gases to expand to fill the full transverse width W of the reaction chamber before the reactant gases reach surfaces of the substrates to be coated. The increase in gas volume in the input plenum further serves to reduce the gas flow velocity and gas pressure prior to the gas reaching the reaction chamber so that gas flow into the reaction chamber is less turbulent and less likely to generate eddy currents as it flow through apertures, or around obstacles, such as substrate support trays, or changes direction.

The exit port (4500) comprises a large aperture, e.g. 200 mm (7.87 inches), substantially centered with respect to the transverse width W and positioned approximately two thirds of the longitudinal length L away from the front edge (9080). The exit port (4500) is positioned proximate to a narrow width of a trapezoidal exit plenum (10050). As will be further described below, the bottom liner wall (4110) cooperates with a bottom substrate tray (4220) to substantially enclose a trapezoidal output plenum conduit or volume and the output plenum conduit or volume is open to a back region of the reaction chamber over its full transverse width W. In preferred embodiments, the exit plenum conduit is shaped in a manner that allows gas to be draw from the reaction chamber substantially over its full transverse width W and to continuously decrease in volume as it flows from the reaction chamber to the exit port (4500). Moreover, the decrease in gas volume provided by the shape of the output plenum conduit preferably allows outflow gases to contract in volume from the full transverse width W of the reaction chamber to a smaller volume before the outflow gases reach the exit port (4500). The decrease in gas volume in the exit plenum conduit further serves to increase the gas flow velocity and gas pressure prior to the gas exiting the exit plenum conduit and this increase in flow velocity reduces the time required to purge the reaction chamber thereby reducing the per monolayer cycle time.

The bottom liner wall (4140) includes an upper horizontal wall portion (10060), shown black in FIG. 7 and two lower horizontal wall portions (10070) and (10080). All three horizontal wall portions (10060-10080) are substantially parallel and horizontal. The upper horizontal wall portion (10060) is separated from each of the lower horizontal wall portions (10070) and (10080) by approximately 20 mm (0.78 inch).

The upper horizontal wall portion (10060) forms a floor surface of the reaction chamber (4190) and may be used to support the bottom substrate tray (4220) thereon. A triangular lower horizontal wall portion (10070) comprises a bottom surface of the triangular plenum (10040) and includes the input port (9010) passing therethrough. A trapezoidal horizontal wall portion (10080) comprises a bottom wall of the trapezoidal plenum (10050) and includes the exit port (4500) passing therethrough. The triangular plenum (10040) is bounded by a continuous triangular vertical wall (10090) that extends between the upper horizontal wall portion (10060) and the lower horizontal wall portion (10070). The trapezoidal plenum (10050) is bounded by a continuous trapezoidal vertical wall (10100) that extends between the upper horizontal wall portion (10060) and the lower horizontal wall portion (10080).

Referring now to FIG. 10 a side section view of the chamber (4000) schematically depicts gas flow through the reaction chamber when a plurality of horizontal substrate support trays (4210) are installed therein. The bottom substrate support tray (4220) is supported parallel with and substantially in contact with the upper horizontal wall portion (10060) to partially cover and form a top wall of each of the triangular plenum conduit (10040) and the trapezoidal plenum conduit (10050). As gasses enter the input plenum conduit through the input port (9010) they expand in volume to fill the triangular input plenum conduit. However, the location of the bottom support tray (4220) acts as a baffle or vane that prevents upward flow of the gasses out of the triangular input plenum conduit (10040) except at the base or widest part of the triangular input plenum conduit proximate to a front edge of the reaction chamber (4190). In particular, the bottom substrate tray (4220) and each of the other substrate trays is positioned with it's front edge approximately disposed along the dashed line A shown in FIG. 7, which is approximately 30 mm (1.18 inch) from the front edge (9080).

Forward of the dashed line A, gasses flowing through the triangular plenum conduit begin to expand vertically upward to substantially fill a front vertical gas flow channel (10110). The front vertical gas flow channel (10110) extends vertically upward from the triangular input plenum conduit to the top liner wall (4130) and extends horizontally substantially across the entire transverse width (W) of the reaction chamber (4190).

The front vertical gas flow channel (10110) is in fluidic communication with the reaction chamber (4190) above the bottom substrate tray (4220), over the longitudinal length (L) and transverse width (W), and has a vertical height that encloses the five horizontally disposed substrate support trays (4210) which are spaced vertically apart with sufficient open space in between trays to allow a sufficient volume of reactant gas or source material to flow over each substrate tray. In particular, the gas continues to expand and flow from the front vertical flow channel (10110) into the open volume between the substrate trays (4210 and 4220) where the gas flows over and around any substrates that are supported on the substrate trays. Moreover, the gas or source material flow between the substrate trays is substantially uniformly distributed over the chamber transverse width (W) to ensure that a flow of precursor material makes contact with the entire width of each substrate supported on a support tray. Moreover, since the input source gases are expanded to the full width (W) prior to or substantially simultaneously with entering the volume between the support trays, the source material is more uniformly distributed across the width (W) and the gas flow over the substrates is less turbulent than if the source material was still expanding over the with dimension (W).

The location of a back edge of the bottom support tray (4220) acts as a baffle that prevents downward flow of the gasses into the trapezoidal plenum conduit (10050), except at the widest part of the trapezoidal plenum (10050), proximate to the back liner wall (4170). In particular, the bottom substrate tray (4220) and each of the other substrate trays is positioned with back edges thereof approximately disposed along the dashed line B shown in FIG. 7, which is approximately 30 mm (1.18 inch) from the inside surface of the back liner wall (4170).

Forward of the dashed line B, gasses are flowing over the five substrate trays and are blocked from flowing directly into the trapezoidal output plenum conduit by the bottom substrate tray (4220). Rearward of the dashed line B, gasses passing over the substrate trays enter into and substantially fill a rear vertical gas flow channel (10120). The rear vertical gas flow channel (10120) extends vertically from the trapezoidal lower horizontal wall (10080) to the top liner wall (4130) and extends horizontally substantially across the entire transverse width (W) of the reaction chamber (4190). Moreover, the trapezoidal exit plenum conduit rearward of the dashed line (B) forms a substantially rectangular aperture over the full width (W) which draws gases out of the reaction chamber over the full width (W) when the vacuum pump is drawing gas through the exit port (4500).

The rear vertical gas flow channel (10120) is in fluidic communication with the open volume between the substrate support trays (4210) and (4220) where reaction gases flow over and around any substrates that are supported on the substrate trays. Accordingly reaction gases entering from the triangular plenum conduit (10040) expand and or are drawn in response to operation of the vacuum pump through the exit port to flow from the front vertical gas flow channel (10110) into the open volume between the substrate support trays (4210) and (4220), into the rear vertical gas flow channel (10120) and then into the trapezoidal output plenum conduit.

In the case where the vacuum valve (4250) is closed and or the vacuum pump is not drawing gas through the exit port (4500), the gas dynamics within the reaction chamber volume are substantially governed by expansion of the input gasses which expand to fill the volume of the input plenum conduit, the reaction chamber and the output plenum conduit. In the case where the vacuum valve (4250) is opened and gas is being drawn out from the chamber by the vacuum pump, a low gas pressure area is established in the trapezoidal plenum (10050) at the narrowest part of the trapezoidal plenum (10050) surrounding the exit port (4500) and the low pressure surrounding the exit port draws gas from the widest part of the trapezoidal plenum (10050) and from the rear vertical gas flow channel (10120) substantially uniformly across the entire transverse width (W). In either case, the baffling provided by the bottom support tray (4220) prevents gas exiting the triangular input plenum conduit except to the front vertical gas flow channel (10110) and only after the input flow is expanded in volume across the entire width (W). Similarly, the baffling provided by the bottom support tray (4220) prevents gas from entering the trapezoidal output plenum conduit except from the rear vertical gas flow channel (10120) and gas drawn into the trapezoidal output plenum conduit is drawn across the entire width (W). Thus according to the present invention, source material flowing through the reaction chamber is substantially uniformly distributed over the entire transverse width (W) including as it flows through the open volume between the substrate support trays (4210) and (4220) where reaction gases flow over and around any substrates that are supported on the substrate trays.

Figure 20:
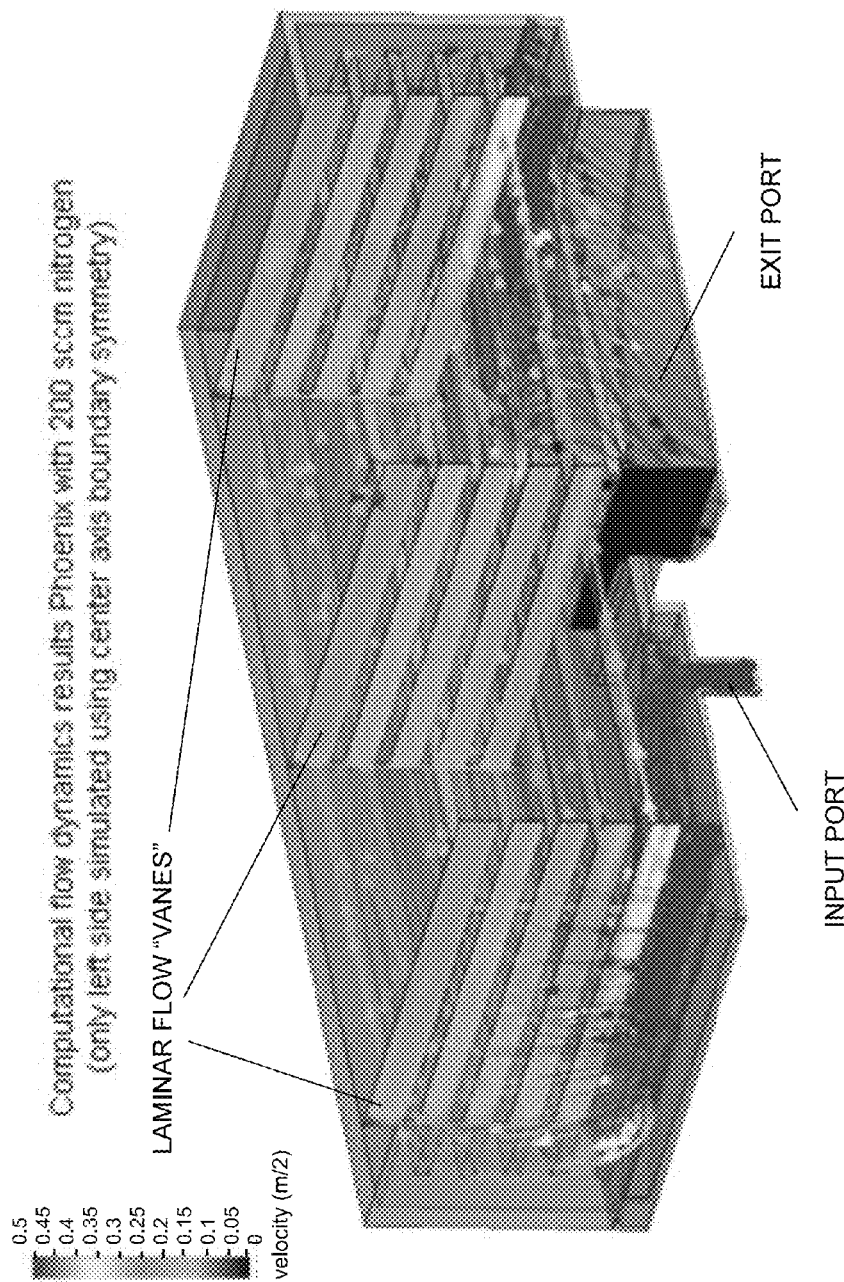
FIG. 20 depicts a graphical representation of the results of a computational flow analysis model corresponding with the first chamber embodiment.

Referring now to FIG. 20, a computational flow dynamic diagram depicting graphical results of a computer flow analysis of the above described reaction chamber assembly (4000) is shown for one half of the width (W). In particular, an isometric section view of a left half of the width (W) of the first exemplary embodiment of the reaction chamber assembly (4000) is shown with gas flow directions in each region of the reaction chamber assembly indicated by flow vectors each having an arrow head directed along a flow direction and with different flow velocities at flow vanes positioned at various regions of the reaction chamber indicated by different shades of grey. As shown in FIG. 20, the computational analysis indicates that the flow direction of substantially all of the source material flowing through the open volume between the substrate support trays is substantially orthogonal to the width (W) and that the velocity of the source material flowing through the open volume between the substrate support trays is substantially constant across the width (W) and lower than the flow velocity in either the front or rear vertical gas flow channels (10110) and (10120). Moreover, the velocity of the source material flowing through the open volume between the substrate support trays is substantially constant over each of the four substrate support trays (4210) and slightly higher over the bottom support tray (4220). It is further pointed out that the configuration of the above described reaction chamber assembly (4000) was optimized using a computational flow analysis program and flow dynamic diagrams such as the one shown in FIG. 20 to vary parameters such as the shape of the input and output plenum conduits, the position and diameter of the input and output ports, the separation between and position of the front and back edges of the substrate support trays and other parameters in order to provide a reaction chamber assembly design that provides uniform flow direction and velocity over substrates supported on the substrate trays. Moreover, the computation model was used to simulate chamber purge sequences and to optimize the chamber parameter to minimize the time required to purge the reaction chamber between precursor cycles.

As will be recognized by those skilled in the art, the volume of the front and rear flow channels (10110) and (10120) can be varied by changing the positions of front and back edges of the substrate support trays (4010) and (4020) and especially the bottom support tray (4020). In other variations of the five substrate tray configuration described above, the reaction chamber can be configured with just one bottom substrate support tray (4020) to provide the desired input and output plenum conduit baffling. Alternately, one or more plenum baffles can be installed or integrally formed in the bottom liner wall (4140) instead of the using the bottom support tray (4020) as a baffle. In other configurations, the chamber can be configured with any number of substrate trays and or with other substrate holders suitable for non-rectangular substrates such as circular wafers and any other object(s) that can be fit into the reaction chamber through the access door. Moreover, the shape and or orientation of the input and output plenum conduits may vary provided that the volume of the source material is expanded in the input plenum to one of the full width (W) or length (L) of the reaction chamber or of substrates supported in the reaction chamber and the source material is drawn out of the reaction chamber through an output plenum conduit having that draws gas across one of the full width (W) or length (L) of the reaction chamber or of substrates supported in the reaction chamber and that compresses the gas volume in the output plenum conduit.

ALD System Second Embodiment

Figure 11:
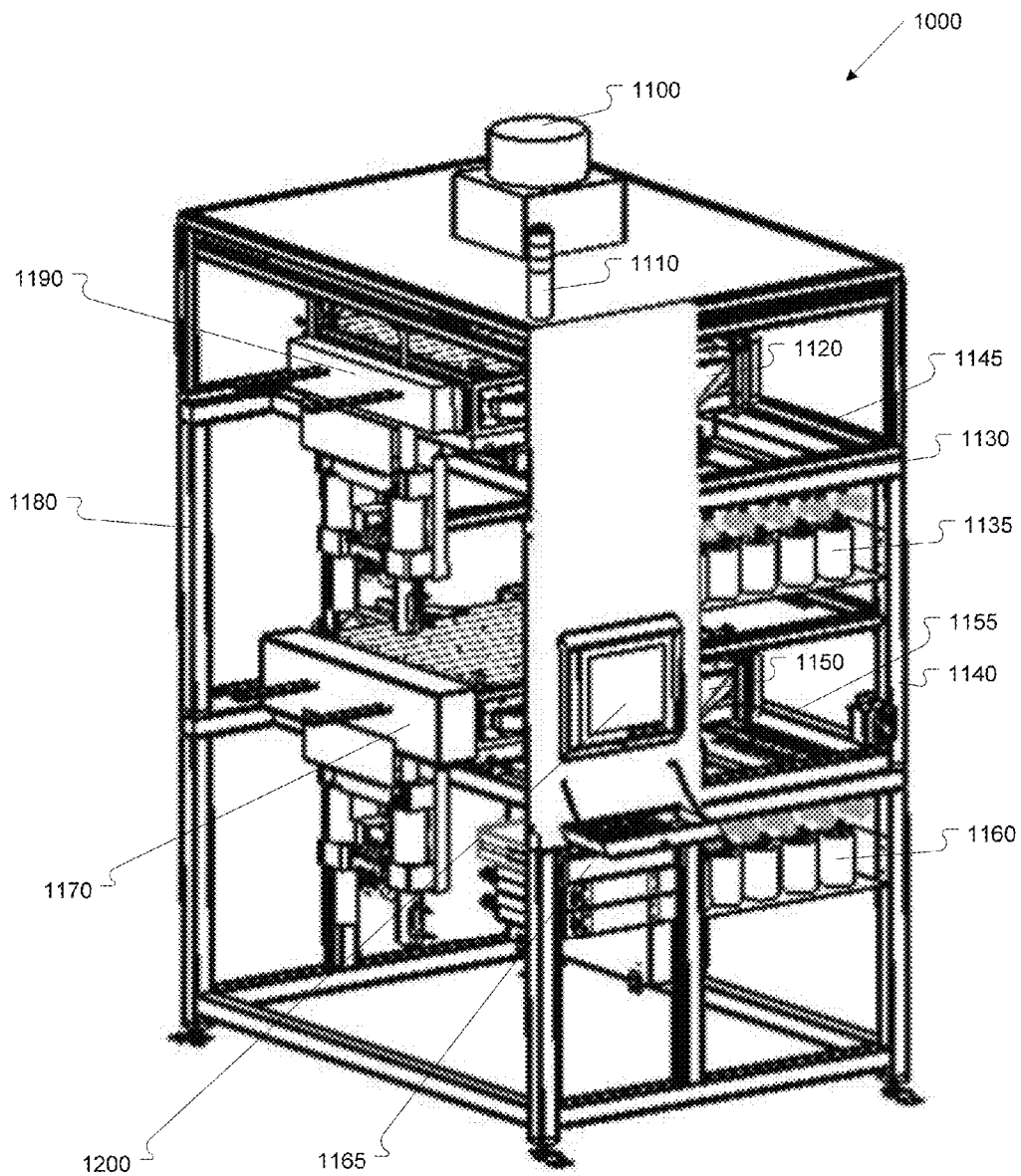
FIG. 11 depicts an isometric view showing a dual chamber gas deposition system without external skins according to an embodiment of the present invention.

A second exemplary embodiment of the present invention comprises a dual chamber gas deposition system (1000)

shown in isometric view with the external skins removed in FIG. 11. The system (1000) includes a front face (1180) which is used for loading substrates into each of two gas deposition chambers (1120) and (1150). In a preferred embodiment, the front face (1180) interfaces with a clean room wall and the substrates are loaded and unloaded from inside the clean room through the clean room wall. For that reason, the removable liners installed into and removable from each of the gas deposition chambers of the second exemplary embodiment are installed and removed through a back face, opposed to the front face (1180).

A right side face (1130) includes a single user interface device (1200) which can be used to enter commands for operating both of the gas deposition chamber assemblies (1120) and (1150). In alternate embodiments, each gas deposition chamber assembly may include a separate user interface device (1200). In further alternate embodiments, the control systems of both gas deposition chamber assemblies can be networked to a remote device that includes a remote user interface, not shown.

The system (1000) comprises a frame (1140) constructed to support an upper ALD reaction chamber assembly (1120) supported by an upper cross frame platform (1145) and a lower ALD reaction chamber assembly (1150) supported by a lower cross frame platform (1155). Each of the chamber assemblies (1120) and (1150) is constructed to receive a single large area rectangular substrate therein and to support the substrate in a substantially horizontal plane. In the present example, each reaction chamber assembly (1120) and (1150) is configured to coat a single GEN 4.5 glass substrate, which has rectangular dimensions of 920 mm wide by 730 mm long. The chamber assemblies (1120) and (1150) are configured with a front opening or load port having a width dimension that is larger than 920 mm for receiving the desired substrate wide dimension through the front port. In particular, the load port is formed by the outer aperture (8010), shown in FIG. 17, which extends through the outer wall assembly (8000) and the chamber aperture (6030), shown in FIG. 15, which extends through the removable liner (6000). Each substrate comprises a top face, to be coated, and an opposing bottom face that is not coated. The substrates have an approximate thickness of 0.5 mm, and are therefore fragile and difficult to handle. The glass substrates are used to manufacture rectangular LCD screens and the like. Each chamber assembly includes a horizontal substrate support tray having a top surface for receiving a bottom face of a substrate thereon with an opposing top face of the substrate top face facing upward. Generally one GEN 4.5 substrate is loaded into a chamber assembly at a time for coating; however, a plurality of smaller glass substrates can be loaded into each of the chamber assemblies (1120) or (1150) and coated simultaneously. Moreover, in further embodiments of the present invention, each chamber may include a plurality of horizontally disposed substrate support trays horizontally disposed one above another and each sized to receive one GEN 4.5 substrate thereon with a top face of the substrate facing upward for coating.

The frame (1140) supports a plurality of subsystems associated with each of the two chamber assemblies (1120) and (1150). In particular, the system (1000) includes all of the subsystems required to operate each of the two chamber assemblies (1120) and (1150) independently and simultaneously. Accordingly, the upper gas deposition chamber assembly (1120) includes an upper input gas supply system (1135) and the lower chamber assembly (1150) includes a lower gas input supply system (1160). Each of the input gas supply systems (1135) and (1160) include reservoirs of reactant gases or solid or liquid reactants that can be carried in an aerosol or vapor for delivering various precursors used in ALD coating cycles into the reaction chamber assemblies. In addition, the input gas supply systems (1135) and (1160) may include inert gases usable to purge various areas of the reaction chamber assemblies and other reactants or precursors that can be delivered into a reaction chamber as may be required for reacting with solid substrates contained within the reaction chamber assemblies. In addition, each of the input gas supply systems (1135) and (1160) includes one or more manifolds, mass flow controllers, sensors, filters, vaporizers, bubblers, atomizes or the like as may be required to prepare and delivering a volume or mass flow rate of gas or vaporized reactant and or a purge gas into the corresponding input plenum. Additionally, each gas supply system may include a heater and temperature sensors for delivering gases at desired temperatures.

Each gas deposition chamber assembly (1120) and (1150) includes a front facing load port with a load lock access door (1190) and (1170) disposed to move vertically downward, or upward as may be required to provide access to the respective chamber through its front facing load port and to move vertically upward, or downward, to close the load port and substantially gas seal the gas deposition chamber during substrate coating cycles. Each gas deposition chamber assembly (1120) and (1150) includes an electronic controller (1165), only one shown, for controlling operations of the respective chamber, including performing thin film deposition cycles, for logging data, and for processing operator input commands. In addition, both of the electronic controllers (1165) are preferably connected to a computer network in order to communicate with and exchange data and or operating commands with external devices, including a robotic substrate loading and unloading device, as may be required. Generally, each electronic controller (1165) includes a programmable microprocessor, one or more digital memory devices, a network interface, a user interface, a power distribution module and interfaces to each electrical subsystem used to operate the chamber assembly. Each gas deposition chamber assembly (1120) and (1150) further includes a vacuum pump or other vacuum source and associated vacuum hardware, detailed below, for pumping a corresponding reaction chamber down to a gas pressure suitable for thin film deposition coating cycles and for purging the reaction chamber by removing contaminants, unused precursors, reaction byproducts, and the like, from the respective chamber and for otherwise processing and managing gas outflow from the chamber. In addition, each gas deposition chamber assembly (1120) and (1150) includes elements for heating and insulating the outer walls of the reaction chamber and or monitoring conditions such as gas pressure, various temperatures, load lock door position, whether a substrate is loaded, safety and other conditions. In addition, the preferred dual chamber gas deposition system (1000) includes a vent (1100) located in the center of a top face for venting gas outflow from the vacuum pump and or from both chambers to a safe venting area, and a lighting tower (1110) extending upward from the top face and including several different colored lighting elements that are used to display an operating status of the dual chambers (1120, 1150).

Reaction Chamber

Referring now to FIGS. 12-17, a preferred gas deposition chamber assembly (3000) according to a second embodiment of the present invention is shown in various views with like elements having the same reference number. The chamber (3000) is shown in front isometric view in FIG. 12, in rear isometric view in FIG. 13 and in section view with the section A-A being shown in FIG. 14. In addition, the removable liner assembly (6000) is shown in isometric view in FIG. 15 and the outer wall assembly is shown in isometric view in FIG. 17. As best viewed in FIGS. 14, 15 and 17, the chamber assembly (3000) comprises an outer wall assembly (8000) surrounding an outer volume (3070) and removable liner (6000) for installing into the outer volume (3070) through a second outer aperture, (8020), passing through a back wall of the outer wall assembly (8000). The chamber assembly (3000) further includes an input plenum (3150) and input port assembly (3230) for delivering gas reactants into the reaction chamber through a right side wall (8030) and an exit or output plenum (3250) and exit port assembly (3310) for removing gases from the reaction chamber through a left side wall (8040).

The outer wall assembly (8000) generally encloses an oven structure and the removable liner (6000) generally encloses a reaction chamber (3125) and provides one or more substrate support surface (3350) horizontally disposed therein. The removable liner (6000) as well as plenum liners (7015) and (7080) cooperate to substantially prevent precursors or reactants from reacting with inside surfaces of the outer wall assembly (8000). Each of the removable liner (6000), plenum liners (7015) and (7080), input and output plenums (3150) and (3250), plus a removable inner panel on the access door, detailed above in the description of the first embodiment, are removable from the chamber assembly (3000) when they become contaminated by reactants or reactant byproducts to either be replaced or cleaned for reuse.

Figure 13:
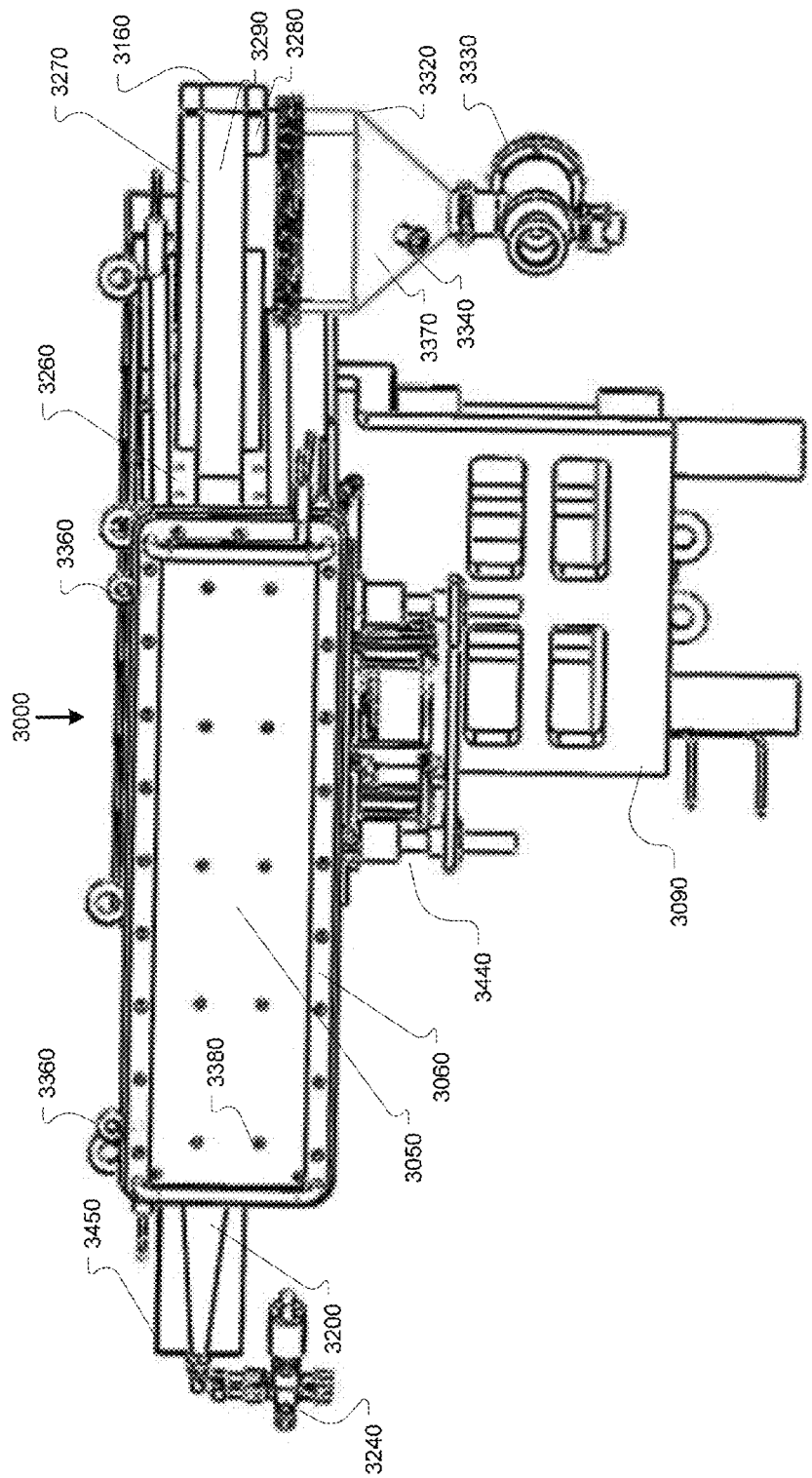
FIG. 13 depicts a back isometric back view of a gas deposition chamber assembly according to an embodiment of the invention.
Figure 17:
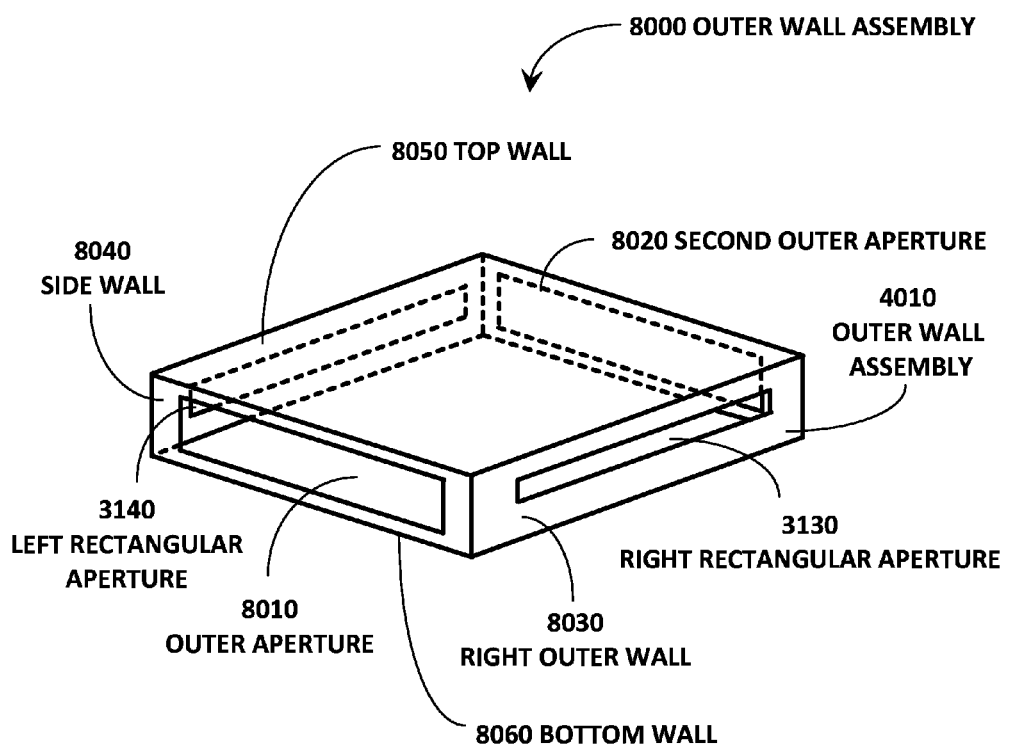
FIG. 17 depicts an isometric view of a second exemplary outer wall assembly according to the present invention.

Referring to FIGS. 13 and 17, the outer wall assembly (8000) comprises a plurality of outer walls formed by opposing top and bottom rectangular outer walls (8050) and (8060) attached to opposing left and right rectangular outer walls (8040) and (8030) for enclosing an outer volume (3070). As best viewed in FIGS. 13 and 17, a back outer wall includes a rectangular second outer aperture (8020) surrounded by back edges of the top, bottom, left and right outer walls. A removable back panel (3050) mounts to the back edges of the top, bottom, left and right outer walls with a back perimeter flange (3060). The flange (3060) includes a rectangular o-ring, not shown, disposed between the flange (3060) and a back face of each of the top, bottom, left and right outer walls to substantially gas seal the outer volume (3070). The second outer aperture (8020) is configured to receive the removable liner (6000) there through and provides back access to the outer volume (3070) for installing the removable liner (6000). The back panel may also attach to the removable liner (6000) before or after installing the removable liner (6000). A second rectangular o-ring, not shown, may also be disposed between the back panel (3050) and a removable liner back wall (6040) to substantially gas seal the reaction chamber. The back panel (3050) may also include eye bolts (3360), or the like, attached thereto, suitable for attaching to a lifting device in order to support the back panel and attached removable liner (6000) from above during installation and removal. A first outer aperture (8010), passes through a front wall of the outer wall assembly (8000) to provide access to the outer volume (3070). Substrates to be coated are inserted into the removable liner (6000) through the outer aperture (8010) and the chamber aperture (6030) which are substantially co-aligned when the removable liner is installed into the outer volume (3070).

The outer wall assembly (8000) encloses the outer volume (3070) with the top and bottom (8050) and (80600) and left and right (8040) and (8030) walls. In the present example, the outer volume (3070) has rectangular cross-sections in a horizontal and a vertical plane. The first or front rectangular outer aperture (8010) passes through a front wall of the outer wall assembly (8000) or is formed by front inside edges of the top, bottom and side walls of the outer wall assembly (8000). The first outer aperture (8010) provides front access into the reaction chamber (3125) for inserting and removing substrates into the reaction chamber (3125) through the chamber aperture (6030) that passes through the removable liner. The second outer aperture (8020) passes through a back wall of the outer wall assembly or is formed by back inside edges of the top, bottom and side walls of the outer wall assembly and is provided to receive the removable liner (6000) into the outer volume there through. The second outer aperture (8020) is gas sealed by the back panel (3050). This embodiment is particularly preferred when chamber assembly front face (1180) interfaces with a clean room wall or the like and substrates installed into the reaction chamber are installed into the reaction chamber through the open access door, described below, from the clean room. In this case, it would not be acceptable to install or remove the removable liner (6000) through the front face (1180) because access to the front face is from inside the clean room. Instead, the second embodiment provides access for installing the removable liner through the second outer aperture (8020).

A movable access door (3080) is movably supported with respect to a support structure (3090) which is fixedly attached to the bottom outer wall (8060). A door actuator (3100) is disposed between the support structure (3090) and the access door (3080) to guide and transport the movable access door along a vertical axis. In a down position, the access door exposes the outer aperture (8010) to provide access the outer volume (3070) and further exposes the chamber aperture (6030) that passes through a front face of the reaction chamber (3125) enclosed by the removable liner (6000). In an up position, the access door (3080) closes and gas seals both the outer aperture (8010) and the chamber aperture (6030) during coating cycles. The gas seal is provided by two rectangular o-rings, not shown, attached to an inner panel of the access door (3080) as described above in the first embodiment.

Generally, the outer wall assembly (8000) comprises an oven structure that includes or may include resistive heating elements, or the like, (3110) disposed on or in grooves formed in external surfaces of all or some of the outer walls. Alternately, according to an advantage of the present invention, the heating elements (3110) may be disposed on or in grooves formed on internal surfaces of some or all of the outer walls because the removable liner prevents the internal surfaces of the outer walls and any heating elements disposed thereon from being contaminated by reactants. Otherwise, the heating elements (3110) can be disposed inside some or all of the outer walls such as by being sandwiched between opposing outer wall portions. The heating elements (3110) heat the outer wall assembly (8000) to a desired temperature and maintain the outer wall assembly at the desired temperature over prolonged periods of use. In addition, solid substrates that are being coated in the reaction chamber are heated to a desired reaction temperature after they have been installed into the reaction chamber, e.g. ranging from 85 to about 500° C., and or the solid substrates may be preheated before being inserted into the reaction chamber to reduce substrate heating times. Additionally, separately controllable heating elements may be disposed proximate to or assembled to substrate support trays to more directly and quickly heat substrates to a desired reaction temperature. Accordingly, the chamber assembly (3000) includes temperature sensors and one or more controllers for controlling the operation of the heating elements to achieve and maintain desired operating temperatures. Alternately, other heating means including heating elements disposed external to the outer wall assembly (8000) are usable without deviating from the present invention. In still further embodiments, the chamber assembly (3000) may not require heating elements or may instead include cooling elements to achieve desired reaction temperatures without deviating from the present invention.

When heating elements are disposed outside the outer volume (3070) it is desirable to direct thermal energy into the outer volume (3070). Accordingly, the outer walls (8030, 8040, 8050 and 8060) preferably comprise a material having a high thermal conductivity in order to provide a conductive path between the heating elements (3110) and the outer volume (3070). In addition, it is desirable that the outer wall material meet its structural and thermal property characteristics over the range of operating temperatures that the chamber assembly (3000) is expected to be subjected to.

Ideally, the outer wall assembly (8000) including the back panel (3050) and access door (3080) comprises a substantially gas tight structure when the access door (3080) in a closed position. In particular, the outer volume (3070) may be pumped to low, medium or high vacuum pressures ranging from less than 760 torr to 10 microtorr. In addition, the vacuum pump operates to remove contaminants, reactants, and reactant byproducts from the chamber assembly. Accordingly, it is desirable to join the outer walls (8030, 8040, 8050, and 8060) with welded seams to prevent gas leaks and to configure any ports and fittings associated with the ports that pass through the outer walls with gas tight gaskets and the like as are generally used in vacuum or gas tight chambers.

In the present example, the preferred material for constructing the outer walls (8030, 8040, 8050, 8060)) is aluminum and particularly 6061 aluminum, which has good weldability, an acceptable thermal conductivity of approximately 167 W/m-K or 1160 BTU-in/hr-ft$^2$-° F., and a melting temperature of approximately 600° C. or 1150° F. Alternately, any weldable aluminum and other weldable metals can be used without deviating from the present invention. Preferably, the outer walls (8030, 8040, 8050, 8060)) comprise sheet or plate stock, folded, formed, machined, welded and fastened together as required to enclose the outer volume (3070) with gas tight seams and to provide the desired structural and thermal performance characteristics. Moreover, one or more of the outer walls (8030, 8040, 8050, 8060) may be made thicker than required to perform structurally in order to provide a heat sink suitable for maintaining the outer wall assembly (8000) at a desired operating temperature and allow quick reheating e.g. after the access door has been opened and new substrates have been added for coating. In the preferred embodiment, a layer of thermal insulation is disposed over the external surfaces of the outer walls (8030, 8040, 8050, and 8060) and back panel (3050) as well as in the access door (3080) to reduce thermal radiation to the air surrounding the outer wall assembly.

Input and Output Plenums

Figure 12:
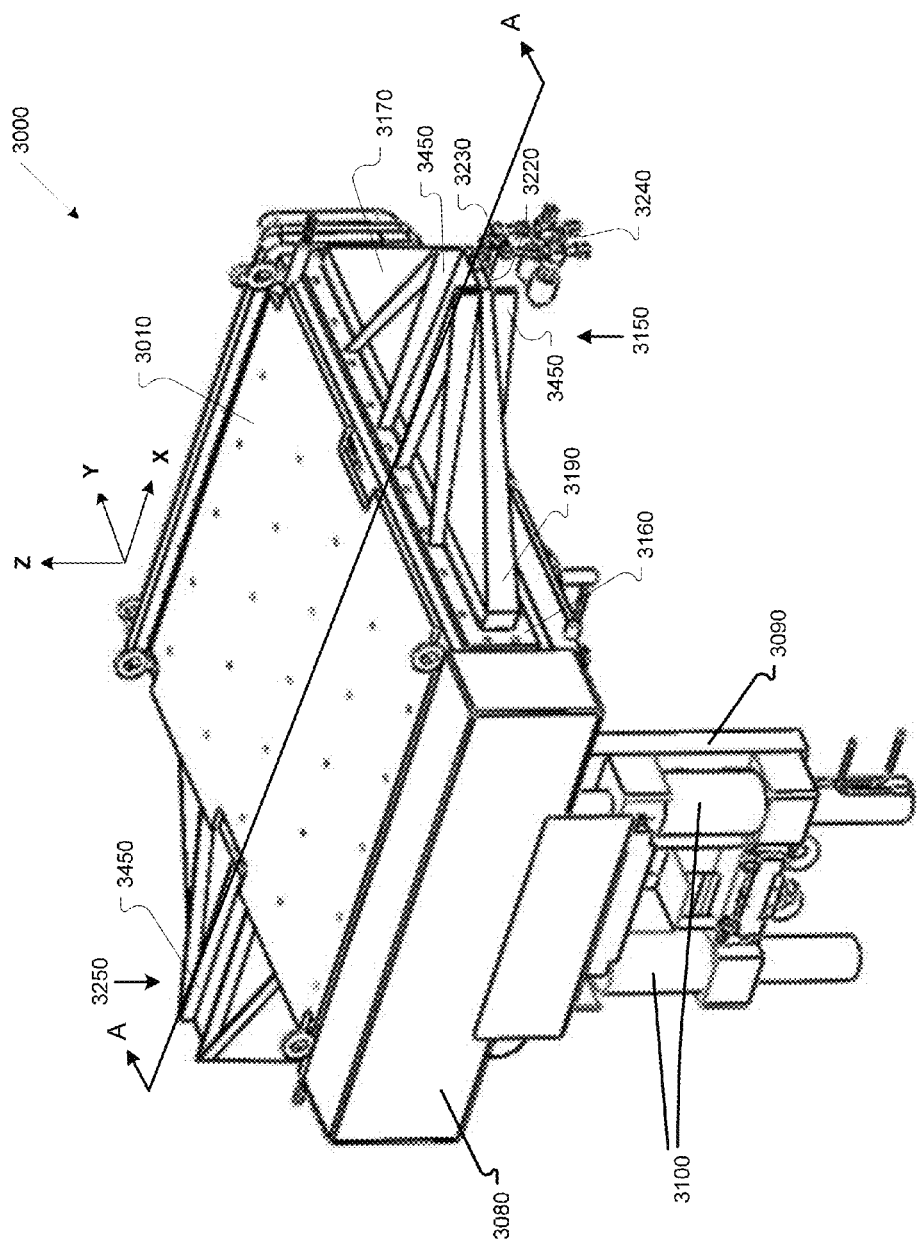
FIG. 12 depicts a front isometric front view of a gas deposition chamber assembly according to an embodiment of the invention.
Figure 14:
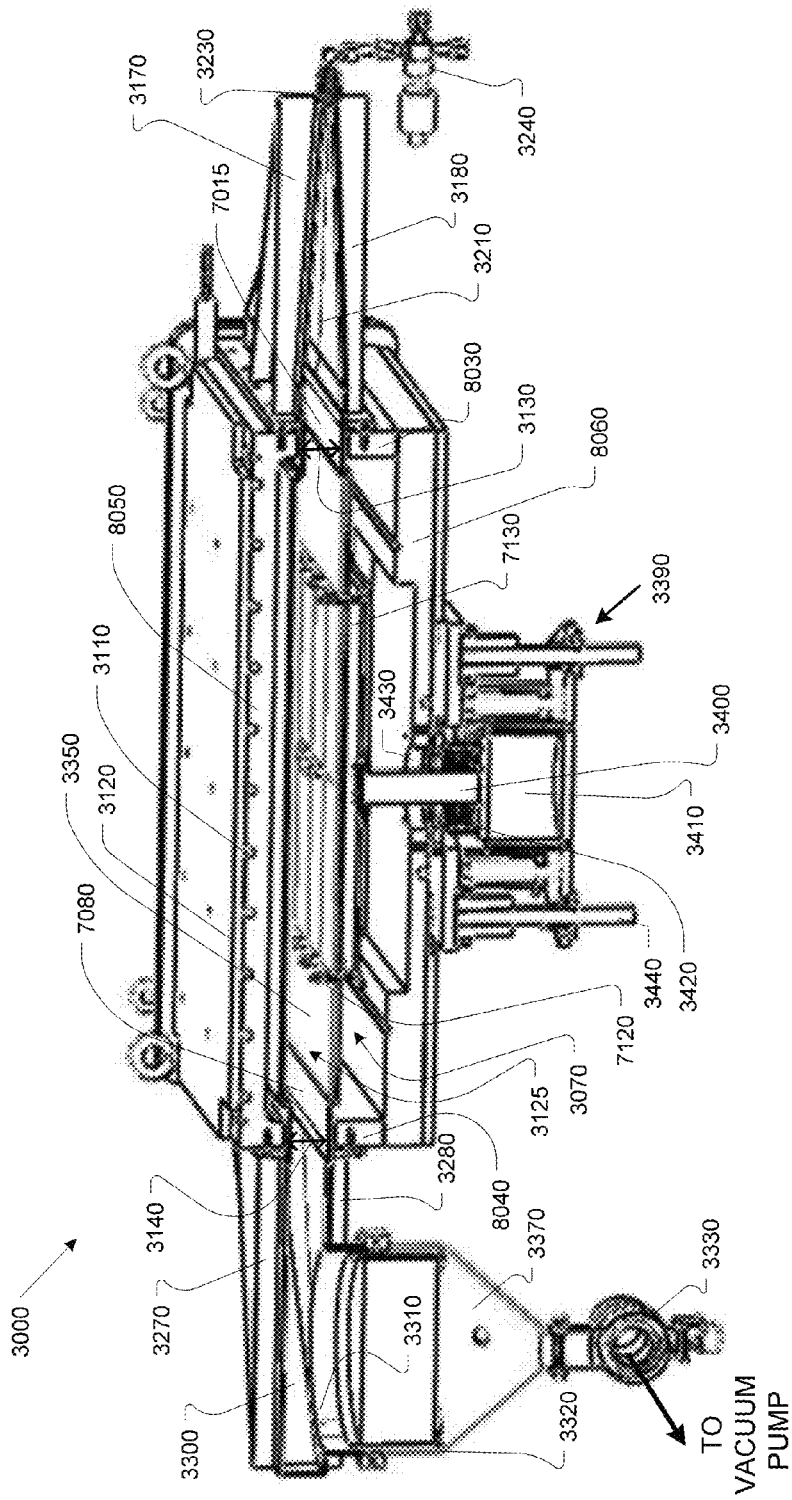
FIG. 14 depicts an isometric view of showing section A-A taken through a gas deposition chamber assembly according to an embodiment of the invention.

Referring now to FIGS. 12, 14 and 17, the right outer wall (8030) extends along a Y-axis and is formed with a right rectangular through aperture (3130) passing there through to the outer volume (3070). A corresponding right rectangular through aperture (6050) passes through the removable liner (6000). The Y-axis dimension and position of both the right rectangular through apertures (3130) and (6050) substantially corresponds with the Y-axis position and dimension of a substrate positioned inside the reaction chamber for coating. An input plenum (3150) is attached to the right outer wall (8030) by an input plenum flange (3160). The input plenum flange (3160) forms a gas tight seal with the right outer wall (8030). The bolt pattern and sealing elements of the input plenum flange (3160) and the right outer wall (8030) are modular to allow a user to reconfigure the chamber assembly (3000) with various input plenum configurations or to bolt other elements to the right side outer wall (8030) as may be required, including an output plenum to reverse the flow direction of the chamber assembly.

In the preferred embodiment, the input plenum (3150) comprises opposing substantially triangular shaped top and bottom input plenum walls (3170) and (3180) attached to opposing substantially trapezoid shaped input plenum side walls (3190) and (3200). The top and bottom input plenum walls (3170) and (3180) and the side input plenum walls (3190) and (3200) combine to enclose a substantially triangular shaped input plenum chamber or conduit (3210). A short input plenum end wall (3220) attaches to each of the top and bottom input plenum walls (3170) and (3180) and the side input plenum walls (3190) and (3200) to truncate an apex of the triangular shaped input plenum conduit (3210) at a first or input end of the input plenum conduit (3210). A gas input port (3230) passes through the input plenum end wall (3220) and a gas supply module (3240) delivers a flow comprising one or more gases, vapors or aerosols through the input port (3230) into the input plenum conduit (3210) near the truncated triangular apex at the first end. As best viewed in the isometric views of FIGS. 12 and 13, the width or Y-axis dimension of the triangular shaped input plenum conduit (3210) expands linearly from the apex at the first end to a base dimension of the triangular input plenum conduit (3210) which is open at the second end and forms a rectangular aperture substantially matched to the rectangular dimensions of the right rectangular aperture (3130). Accordingly, the volume of the input plenum conduit (3210) continuously expands from a small volume near the input port (3230) at the first end to a larger volume at the base of the triangular shaped conduit at second end of the input plenum conduit (3210). Thus the input plenum conduit (3210) has a first triangular cross-section in the X-Y plane.

In addition to expanding in volume in the first X-Y plane, the input plenum conduit (3210) may also continuously expand from a small volume near the first end to a larger volume near the second end in a second triangular cross-section in the X-Z plane. In particular, the height or Z-axis dimension of the triangular shaped input plenum chamber (3210) also expands linearly from the first end proximate to the input port (3230) to second end proximate to the plenum flange (3160). Accordingly, gases delivered through the input port (3230) expand to substantially fill the volume of the triangular shaped input plenum conduit (3210) and this causes gas flowing through the input plenum chamber (3210) to expand to substantially fill the right rectangular through aperture (3130) while also reducing the gas pressure and velocity in proportion to distance from the input port (3230). Accordingly, the shape of the input plenum conduit (3210) helps to substantially distribute input gas flow over the entire width of the right rectangular through aperture (3130) which has a width matched to a longitudinal length or Y-axis dimension of a substrate being coated. The triangular shaped input plenum conduit (3210) also helps to prevent turbulent gas flow and eddy currents from being generated inside the input plenum conduit (3210) and contributes to producing a less turbulent gas flow through the right rectangular through aperture (3130) and, as will be described in detail below, less turbulent gas flow over the top surface of a substrate being coated.

The left outer wall (8040) extends along the Y-axis opposed to the right outer wall (8030) and is formed with a left rectangular through aperture (3140) passing through the left outer wall (8040) to the outer volume (3070). A corresponding left rectangular through aperture (6060) passes through the removable liner (6000). The Y-axis dimension and position of both the left rectangular through apertures (3140) and (6060) are matched with the Y-axis position and dimension of the right rectangular through aperture (3130) and to a substrate positioned inside the reaction chamber for coating. Accordingly, gas enters the outer volume (3070) through the right rectangular aperture (3130), passes through the right rectangular through aperture (6065) into the reaction chamber (3125), flows over the top surface of a substrate supported inside the hollow rectangular chamber (3070) for coating, and exits the hollow rectangular chamber (3070) through the left rectangular aperture (3140). An output plenum (3250) is attached to the left outer wall (8040) by an output plenum flange (3260). The output plenum flange (3260) forms a gas seal with the left outer wall (8040). The bolt pattern and sealing elements of the output plenum flange (3260) and the left outer wall (8040) are modular and matched to the bolt pattern of the input plenum (3150) and right side wall (8030) to allow a user to reconfigure the chamber assembly (3000) with various output plenum configurations, as may be required, or to bolt other elements to the left side outer wall (8040) as may be required, including an input plenum as required to reverse the flow direction of the chamber assembly.

In the preferred embodiment the output plenum (3250) comprises opposing substantially triangular shaped top and bottom output plenum walls (3270) and (3280), attached to opposing substantially rectangular output plenum side walls (3290), only one is shown. The triangular shaped top and bottom output plenum walls (3270) and (3280) and the opposing rectangular output plenum side walls (3290), only one shown, combine to enclose a substantially triangular shaped output plenum conduit (3300). A short end wall, not shown, attaches to each of the top and bottom walls (3270) and (3280) and the opposing rectangular side walls (3290), the other not shown, at a first end of the output plenum to truncate an apex of the triangular shaped output plenum conduit (3300). A base of the triangular shaped output plenum conduit is open to the left rectangular aperture (3140) at a second end of the output plenum conduit (3300). Thus the second end of the output plenum conduit forms a rectangular aperture with rectangular dimensions substantially matched to the dimensions of the left rectangular aperture (3140). An exit port (3310) passes through the bottom output plenum wall (3280) and an exit port module (3320) attached to the exit port (3310) is in fluidic communication with a vacuum pump, not shown. Alternately, the exit port (3310) can be formed in the top output plenum wall (3270). Like the input plenum conduit, the output plenum conduit (3300) has a first triangular cross-section in the X-Y plane and may be formed with a second triangular cross-section in the X-Z plane with each cross-section continuously expanding in volume from the first end to the second end.

The exit port module (3320) includes a cone shaped passage (3370) terminated by a stop valve (3330) for closing the exit port (3310). A vacuum pressure gauge (3340) is disposed in the cone shaped passage (3370) for sensing gas pressure in the exit port module (3320). The vacuum pump, not shown, is operated to draw gas through the exit port module (3320) to evacuate the chamber assembly (3000)). As best viewed in the section view of FIG. 14, the volume of the triangular shaped output plenum conduit (3300) is smaller at the exit port (3310) than it is at its base at the output plenum flange (3260) and the triangular shape of the output plenum conduit (3300) draws gas exiting from the reaction chamber substantially uniformly across the entire left rectangular aperture (3140) to draw gas evenly across the entire y-Axis dimension of a substrate supported in the reaction chamber. The narrowing volume of the triangular shaped output plenum also causes the volume of the gas flow to decrease as gas approaches the exit port (3310) thus causing the velocity of gas flowing through the output plenum conduit (3300) to increase as the gas approaches the exit port (3310). The increase in gas velocity proximate to the exit port decreases the cycle time required to purge or evacuate the reaction chamber.

Each of the input and output plenums (3150) and (3250) include structural stiffening ribs (3450) disposed and welded on the top and bottom plenum walls (3170, 3180, 3270, 3280) to prevent the top and bottom plenum walls from buckling under the substantial pressure gradient between a lower pressure inside each plenum and atmospheric external pressure. In addition, each of the input and output plenums (3150) and (3250) is easily removable and replaceable should the plenums become contaminated by reactants or reactant byproducts flowing there through. Preferably, the input and output plenum walls are fabricated from metals, e.g. stainless steel, that are cleanable by mechanical or chemical cleaning processes such as those described above. Moreover internal surfaces of the plenums may be roughened (e.g. by shot or bead blasting) prior to use to improve reactant coating adhesion to the plenum internal surfaces and thereby prevent cracking or flaking of reactant layers between cleaning or replacement cycles.

Accordingly, each of the input and output plenums (3150) and (3250) can be removed for cleaning or swapped with an auxiliary set of clean plenums to avoid production down time. In addition, external surfaces of each of the input and output plenums (3150) and (3250) may be thermally insulated to prevent thermal losses through the plenum walls and the external surfaces may be heated by electrical heating coils disposed thereon to preheat or post heat reactants and reactant byproducts flowing there through. In addition, each plenum may include various sensors for sensing temperature, pressure, gas type, and other conditions inside or proximate to the plenums. In addition, each plenum may include internal baffles, not shown, e.g. disposed on or between internal surfaces of the top and bottom plenum walls (3170, 3180, 3270, and 3280) to more efficiently direct gas flow along desired flow paths inside the plenum.

Gas Flow

Referring now to the section AA shown in FIG. 14, gas entering the triangular input plenum chamber (3210) through the input port (3230) expands to fill the volume of the input plenum conduit (3210) and flows through the right rectangular aperture (3130) with a substantially uniform gas distribution over its Y and Z Axis dimensions. The gas then flows through the reaction chamber (3125) enclosed by the removable liner (6000) and over the top surface of a substrate positioned inside the removable liner (6000) with a substantially uniform gas distribution over the Y axis dimension of the substrate. Thereafter the gas flows through the left rectangular aperture (3140) and into the triangular output plenum chamber (3300) where it is compressed in volume as it flows toward the exit port (3310). Interfaces between the input and output plenum conduits and the left and right apertures are lined by plenum liners described below. The plenum liners primarily function to prevent contamination of the outer volume but are configure to provide eddy free gas flow into and out of the reaction chamber and over leading and trailing edges of the substrate supported in the reaction chamber. More generally, the entire gas flow path from the input port to the exit port is configured provide a smooth flow path free of edges or obstructions that may form eddy currents or the like in flow. In addition, flow path is formed free of blind holes, or other virtual voids that may remain filled with gasses after the chamber has been pumped down to its operating pressure. Accordingly, gas flow through the reaction chamber is substantially uniform in flow direction and velocity and free of eddy currents. Moreover, the direction of flow is substantially parallel with the surface being coated along the X axis with substantially uniform chemical flux and concentration over the Y axis.

The present invention is particularly suited for thin film deposition processes that use self limiting reactions such as ALE and ALD. In one example operating sequence, the reaction chamber initially purged of contaminants such as water vapor. The initial purge is done with the exit valve (3330) open and the vacuum pump or vacuum source drawing gas out of the reaction chamber through the exit port (3310) and an inert gas flowing through the input port (3230). The vacuum pump is operated until the pressure gage (3340) reaches a desired operating pressure for introduction of a first precursor. When the desired pressure is reached, the exit valve (3330) may be closed to seal the exit port and the vacuum pump stopped or the exit valve may remain open and the vacuum pump operating. A first precursor is introduced from the gas supply module (3240) in a pulsed burst comprising a precise mass flow rate delivered over a precise time interval to introduce a measure volume of the first precursor into the reaction chamber. An uninterrupted flow of inert gas continues to flow into the reaction chamber with the first precursor. The first precursor is then purged from the reaction chamber either by opening the exit valve (3330) and operating the vacuum pump if the exit valve was closed or by continuing to operate the vacuum pump for sufficient time to remove the first precursor from the reaction chamber. Thereafter a second precursor is introduced from the gas supply module (3240) in a pulsed burst comprising a precise mass flow rate delivered over a precise time interval to introduce a measure volume of the second precursor into the reaction chamber. Again, the exit valve may be closed or left open during the second precursor cycle which forms a monolayer on exposed substrate surfaces in the reaction chamber. After the second precursor introduction, the reaction chamber is then purged and the entire cycle is repeated as required to build up a desired number of monolayers. After completing the desired number of monlayers, the reaction chamber is purged to atmospheric pressure and the access door is opened to remove the coated substrate(s) and install new substrates for coating.

The joints or seams of the outer walls (8030, 8040, 8050, and 8060) are welded and any flanges, ports or other apertures passing through the outer walls are configured with seals and bolt patterns that are suitable for providing gas tight seals to prevent gas leakage into or out of the plenums or the outer volume. In some applications, the outer walls, the input and output plenums, the movable access door (3080), the back panel (3050) and any ports that pass through any of these elements are constructed for substantially leak proof operation in high vacuum and preferably, the outer volume can be pumped down to vacuum pressures of about 10 microtorr. In addition, the gas supply module (3240) includes a controllable stop valve for closing the input port (3230) and the exit port stop valve (3330) is controllable for closing the exit port (3310) as required by various gas deposition cycles. Accordingly, the outer volume can be isolated and maintained at a vacuum pressure for an extended period as may be required. In addition, the gas supply module and the vacuum pump can be operated continuously to pass a constant gas flow through the outer volume, such as to purge all passages with an inert purge gas such as nitrogen. Otherwise the gas supply module may operate non-continuously to deliver a precise volume of a desired gas, such as a precursor gas, into the reaction chamber.

Removable Liner

Figure 15:
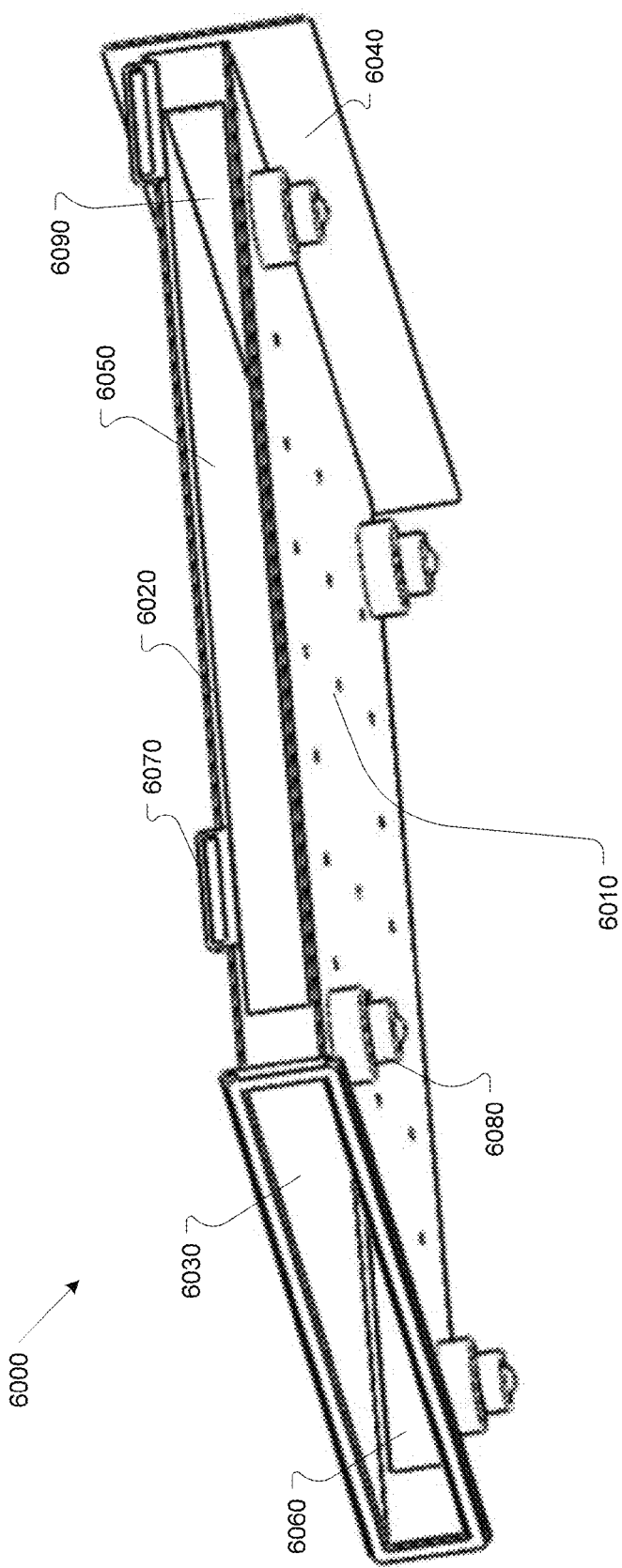
FIG. 15 depicts an isometric view of a welded chamber liner assembly according to an embodiment of the present invention.

Referring now to FIGS. 13, 14, and 15, a removable liner assembly (6000) is shown in isometric view in FIG. 15. The liner assembly (6000) installs into the chamber assembly (3000) through the second outer aperture (8020) formed through the back outside wall when the back panel (3050) is removed. The back panel (3050) and the liner assembly (6000) may be assembled together using the fasteners (3380) and installed into the outer wall assembly as a unit. The liner assembly (6000) includes a bottom liner wall (6010), the top surface of which comprises a substrate support surface (3350) for supporting a substrate being coated. The liner assembly (6000) encloses the reaction chamber (3125) which supports substrates being coated therein. The liner assembly substantially prevents reactants from contaminating internal surfaces of the outer walls (8030, 8040, 8050, and 8060) thereby preventing reactant layers from forming thereon inside.

The liner assembly includes a liner base wall (6010) and an opposing liner top wall (6020). The top surface of the liner base wall (6010) functions as the substrate support surface (3350) shown in FIG. 14. A liner front wall forms a rectangular aperture that serves as the chamber aperture (6030). The chamber aperture (6030) substantially co-aligns with the outer aperture (8010) passing through the front face of the outer wall assembly. A liner back wall (6040) attaches to the back panel (3050) with fasteners (3380) and includes a rectangular back aperture (6090) in order to provide back access to the reaction chamber (3125). An inside surface of the back panel (3050) opposed to the rectangular back aperture (6090) may comprise stainless steel in order to be cleanable by the mechanical or chemical cleaning methods described above. Alternately, the liner back wall (6040) may comprise a solid wall to protect the back panel (3050) from reactant contamination. The back panel (3050) is attached to the outer wall assembly by the back perimeter flange (3060). The liner assembly (6000) includes opposing side walls that each includes a side rectangular through aperture (6050) and (6060) and these side rectangular through apertures align with the left and chamber right rectangular apertures (3140) and (3130) when the liner assembly (6000) is installed inside the chamber assembly (3000). All of the liner assembly walls comprise stainless steel, which is cleanable by mechanical abrasion. Internal surfaces of the liner assembly may be roughed (e.g. by shot or bead blasting) prior to use to improve reactant coating adhesion to the plenum internal surfaces and thereby prevent cracking or flaking of reactant layers between cleaning or replacement cycles. The liner assembly (6000) can be swapped with a clean auxiliary liner assembly when it is contaminated to allow production to continue while the contaminated liner is cleaned. Alternately, the liner assembly (6000) may be disposable after it has been contaminated.

Because the liner assembly weighs about 120 pounds, lifting handles (6070) are provided on the liner top wall (6020) to allow the liner assembly to be supported from an over head crane or a lifting tool by straps or hooks. Similarly, the back panel eye bolts (3360) can be supported by a lifting device while the liner assembly is guided into the outer wall assembly. Four rolling tooling balls (6080), or the like, are mounted on the liner base wall (6010). The rolling tooling balls (6080) contact with and roll along the bottom outer wall (8060) as the liner assembly is guided into the chamber assembly (3000) through the second outer aperture (8020). The height or Z-axis dimension of the tooling balls (6080) establishes the Z-axis position of the substrate support surface (3350) to align the substrate support surface with the left and right rectangular apertures (3140) and (3130) and to position the top surface of a substrate being coated at a desired Z-axis height with respect to gas flow in the chamber. The liner assembly back wall (6040) is formed to make mating contact with back end surface of the outer walls (8030, 8040, 8050, 8060) when the removable liner is installed to provide a thermally conductive path between the heated outer wall and the liner assembly (6000). Alternately or additionally, other surfaces of the liner assembly (6000) may be configured to make mating contact with the outer walls to provide additional thermally conductive paths between the removable liner and the outer walls.

Plenum Liners Substrate Position, Purge Gas and Lift Pins

Figure 16:
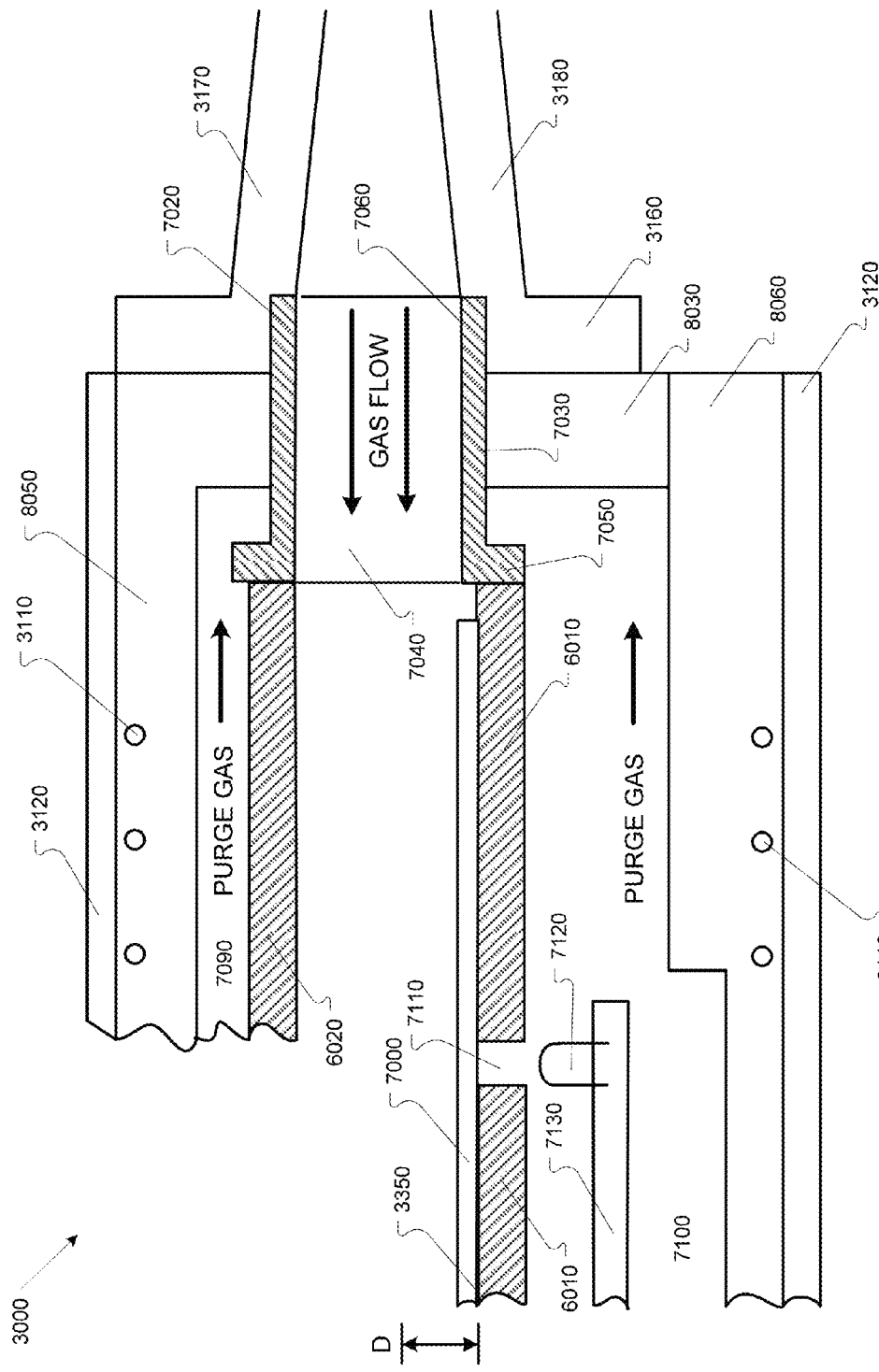
FIG. 16 depicts schematic representation of an exploded section view showing a substrate supported on the chamber liner assembly and a pair of plenum liners according to an embodiment of the present invention

Referring now to FIG. 16, an exploded section view of the right side of chamber assembly (3000) shows the top and bottom input plenum walls (3170) and (3180) and the input plenum flange (3160), the top and bottom outer walls (8050) and (8060), the electrical heaters (3110), thermal insulation layers (3120), the right outer wall (8030) and the right rectangular aperture (3130) passing there through. The bottom and top removable liner walls (6010) and (6020) are shown co-aligned with the right rectangular aperture (3130) such that gas enters the reaction chamber from the input plenum and flows over a substrate (7000) supported on the bottom liner wall (6010) substrate support surface (3350). The left side of the reaction chamber is configured substantially identically.

As is further shown in FIGS. 14 and 16, an input plenum liner (7015) comprises a rectangular tube shaped element formed by opposing top and bottom plenum liner walls (7020) and (7030) and connected opposing back and front plenum liner walls, not shown, configured to enclose a rectangular fluid conduit (7040) disposed between the input plenum conduit (3210) and with the right liner aperture (6050). The input plenum liner installs through the outer wall right rectangular aperture (3130) from inside the outer wall assembly and a flange (7050) thereof butts up against the right liner aperture (6050). The flange (7050) is formed on four sides of the input plenum liner for surrounding the entire right liner aperture (6050) and gas sealing the interface between the flange (7050) and the removable liner (6000). The opposite end of the input plenum liner (7015) interfaces with the input plenum (3150) and forms a gas seal therewith such that gas flows flowing out of the input chamber passes through the rectangular fluid conduit (7040) to the reaction chamber. Accordingly, the input plenum liner prevents reaction gases from contaminating the chamber right outer wall (8030) and from entering the outer volume (3070) except into the reaction chamber (3125). A top surface (7060) of the bottom plenum liner wall (7030) is disposed substantially coplanar with of a top surface of the substrate (7000). Gas exiting from the input plenum flows through the input plenum liner and over the top surface of the substrate (7000). By positioning the input plenum liner top surface (7060) coplanar with the stop surface of the substrate (7000) eddy current formation at the leading edge of the substrate (7000) is avoided. An output plenum liner (7080), shown in FIG. 14, is substantially identical to the input plenum liner described above and installs through the left rectangular aperture (3140).

As best viewed in FIG. 16 open areas of the outer volume (3070) are outside reaction chamber enclosed by the removable liner (6000). In particular, an upper volume (7090) and a lower volume (7100) extend between the removable liner (6000) and the top and bottom outer walls (8050) and (8060). The volumes (7090) and (7100) may also be fluidly connected with each other at the front and rear of the outer volume (3070). In addition, the lower volume (7100) is used to house a movable pin assembly, described below, and the lower volume (7100) is in fluidic communication with the inside of the liner assembly (6000) through pin holes (7110) that pass through the bottom liner wall (6010). To further prevent reactants from contaminating internal surfaces exposed to the upper and lower volume (7090) and (7100) the outer volume (3070) is substantially continuously purged with nitrogen or an inert gas. The purge gas is pumped into the outer volume (3070) or separately into the upper and lower volumes (7090) and (7100) at a low positive pressure (e.g. less than about 5 pounds per square inch) such that a pressure gradient is created by the purge gas causing the outer volume to have a higher gas pressure than the reaction chamber. The pressure gradient further helps to prevent reactants from leaking into the outer volume through the removable liner, plenum liners, or plenums.

Movable Pin Assembly

Referring now to FIGS. 14 and 16 a plurality of lift pins (7120) are movably supported by a movable pin plate (7130) disposed in the lower volume (7100) between the bottom outer wall (8060) and the bottom liner wall (6010). The pin plate (7130) is a rectangular plate and the plurality of lift pins (7120) are arranged in rows and columns with each lift pin fixedly attached to the pin plate (7130) and with the top of each lift pin extending to an equal height above the movable pin plate such that the top of each lift pin (7120) forms one point of a substrate support surface. The bottom liner wall (6010) includes a plurality of through holes (7110) passing there through with one through hole (7110) corresponding with each of the plurality of lift pins (7120). When the movable pin plate (7130) is raised to a lift position, the plurality of lift pins (7120) extend through the plurality of corresponding through holes (7110) to either lift the substrate (7000) away from the substrate support surface (7110) or to position the pin tops at a height (D) above the substrate support surface (3350) for receiving a substrate (7000) on the pin tops. In particular, the height (D) corresponds to a height that allows robotic substrate handler lifting arms to be inserted into the reaction chamber between the pin tops and the substrate support surface (3350) to load a substrate (7000) onto the pin tops or to unload a substrate from the pin tops. When the movable pin plate (7130) is lowered, the pin tops are lowered below the substrate support surface (3350) such that a substrate supported on the pin tops is placed in contact with the substrate support surface (3350). Preferably, the lift pins (7120) remain engaged with the through holes (7110) when the pins are lower to limit the flow of purge gas through the holes (7110), however the pins can be lowered to a position below the bottom liner wall (6010) as shown in FIG. 16.

Referring now to FIG. 14, a pin actuator assembly (3390) is disposed outside the chamber assembly attached to an external surface of the bottom outer wall (8060). A lift post (3400) extends between a pneumatic cylinder and piston assembly (3410) and the movable pin plate (7130) by passing through a circular hole (3430) through the bottom outer wall (8060). A vacuum bellows (3420) extends from the pneumatic cylinder and piston assembly (3410) to the bottom outer wall and gas seals the circular through hole (3430). The pin actuator assembly (3390) further includes a pair of guide rods (3440) for guiding movement of the pneumatic cylinder and piston assembly (3410) and the lift post (3400). The system controller coordinates actuation of the pin actuator assembly to raise and lower the movable pin plate when the access door is open for the loading and unloading of substrates.

Referring to FIGS. 14 and 16, according to the present invention, a rectangular glass substrate to be coated is installed into the reaction chamber (3070) by lowering the movable access door (3080) and raising the movable pin plate (7130). The substrate (7000) is then inserted into the chamber by a robotic substrate handler or another insertion device and set down resting on the tops of the plurality of lift pins (7120). One dimension of the substrate (7000) is substantially centered between the input and output plenums (3150) and (3250) and the other dimension of the substrate is centered with respect to the left and right rectangular apertures (3140) and (3130). The movable pin plate (7130) is then lowered to set the substrate (7000) onto the substrate support surface (7110) and the access door (3080) is closed. The reaction chamber is then heated to raise the substrate to the gas deposition temperature and the vacuum pump is started to remove air and other contaminants from the reaction chamber which may be pumped to a low medium or high vacuum pressure. The reaction chamber also may be purged with an inert gas during the initial pump down to remove contaminants such as water vapor. When the chamber is at the desired pressure and the substrate at the desired temperature, a gas deposition recipe can begin. Generally, the recipe begins by closing the stop valve (3330) and introducing a reactant gas or vapor into the reaction chamber through the input port (3230). Alternately, the reactant can be introduced with the stop valve (3330) open and the vacuum pump operating. After the first reactant has reacted with the substrate, the reaction chamber is purged by running the vacuum pump and flushing the reaction chamber with a purge gas. The cycle is then repeated for a second reactant gas or vapor and the two reactant cycles may be repeated many thousands of times in order to build up a desired coating thickness. When substrate coating is complete, the stop valve (3330) is closed and the chamber is purged to atmosphere through the input port or another port. The movable access door (3080) is opened and the movable pin plate (7130) is raised to lift the coated substrate from the substrate support surface. The robotic substrate handler then removes the coated substrate form the chamber and installs an uncoated substrate into the chamber for the next coating cycle.

ALD System Third Embodiment

Figure 18:
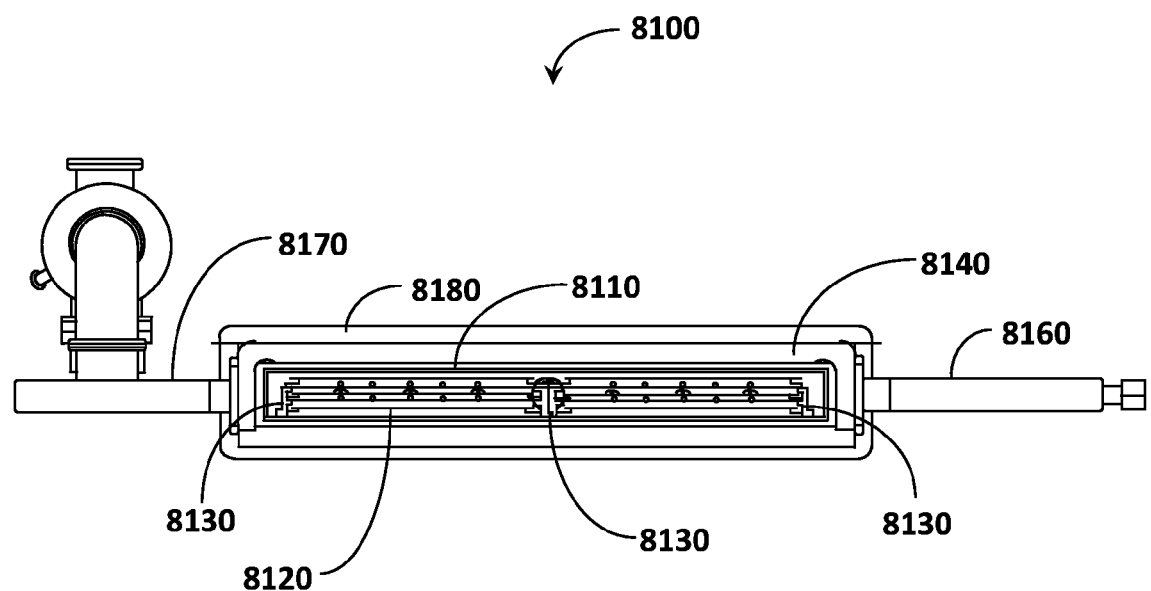
FIG. 18 depicts a front view of a third exemplary embodiment of a reaction chamber assembly configured with a removable liner and six substrate support trays according to the present invention.
Figure 19:
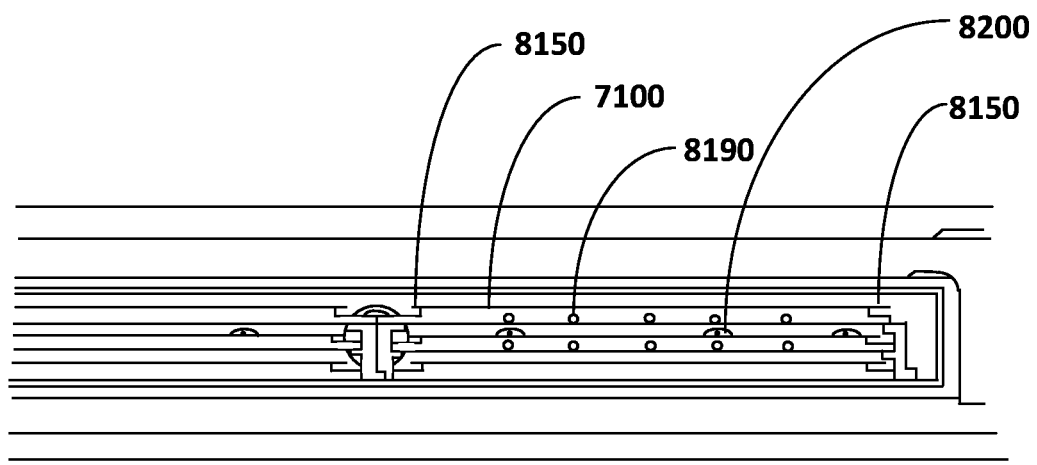
FIG. 19 depicts an exploded front view of a portion of the third exemplary embodiment of a reaction chamber assembly according to the present invention.

Referring now to FIGS. 14 and 18-19, a third embodiment of a chamber assembly (8100) according to the present invention is configured substantially like the reaction chamber (3000) described above except that the X-axis dimension of the chamber assembly (8100) is more than doubled and a removable liner (8110) is configured with six substrate trays (8120) instead on one substrate support surface. The substrate trays (8120) are supported in two stacks of three trays each with side by side substrate trays being substantially coplanar. Substrate trays (8120) are supported at each end thereof by a plurality of tray supports (8130) fixedly attached to the removable liner (8110). Each substrate tray (8120) supports a single substrate (7000) in a substantially horizontal orientation with a surface to be coated facing up.

The removable liner (8110) houses a reaction chamber (8140) suitable for batch coating six rectangular substrates (7000) supported on horizontal substrate trays (8120). The substrate trays are sized to allow the substrates (7000) to overhang the substrate trays (8120) at each end so that opposing edges of the substrates (8150) can be used to pick up the substrates (7000) when a substrate manipulating arm, or the like, is used to pick up and lower substrates using the overhanging edges (8150). Otherwise, the chamber assembly (8100) includes an input plenum (8160) an exit plenum (8170) and an outer wall assembly (8180) all substantially configured like the corresponding elements of the chamber assembly (3000) described above except that the chamber assembly (8100) does not include plenum liners as described above.

Accordingly, reactant gas enters the reaction chamber assembly (8100) from the input plenum (8160), flows through the reaction chamber (8140) and over all six substrates before exiting from the reaction chamber (8140) through the exit plenum (8170). Preferably, the chamber assembly (8100) is configured to coat six GEN 4.5 glass substrates, each having rectangular dimensions of 920 mm wide by 730 mm long in a single coating run or batch. More specifically, the GEN 4.5 glass substrates are supported with the 920 mm dimension disposed along the reaction chamber X-axis.

Each substrate tray (8120) includes a resistive heating element (8190) disposed in grooves along its bottom surface, or otherwise disposed proximate to the substrate tray (8120) for individually heating each substrate tray (8120) and the substrate (7000) supported thereby. Preferably, each substrate tray (8120) comprises ALPASE K100-S, which is an aluminum plate material specifically designed for vacuum applications and provides a relatively high thermal conductivity (e.g. 812 BTU-in/hr-ft$^2$-$^\circ$ F.) to quickly and uniformly conduct thermal energy form the heating elements (8190) to the substrates (7000). Alternately, the substrate trays (8120) can be fabricated from stainless steel so that the trays can be cleaned by mechanical abrasion and reused.

The chamber assembly (8100) also includes an electrical connector (8200) associated with each of the substrate trays (8120) and disposed inside the reaction chamber (8140) along a back wall thereof. The electrical connectors (8200) provide power to the resistive heating element (8190) associated with each substrate tray (8120) and may be configured such that the resistive heating element connects to the electrical connector (8200) when each substrate tray (8120) is mounted in its operating position.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications, those skilled in the art will recognize that its usefulness is not limited thereto and that the present invention can be beneficially utilized in any number of environments and implementations where it is desirable to coat objects with thin layers of material. Accordingly, the claims set forth below should be construed in view of the full breadth and spirit of the invention as disclosed herein.

What is claimed:

1. A reaction chamber assembly suitable for depositing one or more solid material layers on one or more substrates contained therein comprising:
   a substantially gas tight reaction chamber having a floor space footprint;
   a source for delivering a flow of source material into the reaction chamber;
   a removable liner disposed within the reaction chamber and configured to be installed into and removed from the reaction chamber, the removable liner providing a substrate support area therein, the removable liner comprising a chamber aperture to provide access to the substrate support area through the chamber aperture, the substrate support area having an input side and an output side for supporting the one or more substrates in a flow of the source material flowing over the one or more substrates in a flow direction extending from the input side to the output side wherein the substrate support area has a support width and a support height that are both substantially orthogonal to the flow direction; and, an input plenum including an input plenum conduit disposed below the substrate support area within the same floor space footprint as the reaction chamber, wherein the input plenum conduit is defined by the removable liner from an input plenum conduit first end for receiving the flow of source material from the source to an opposing input plenum conduit second end for delivering the flow material to the input side, wherein a width of the input plenum conduit increases from the input plenum conduit first end to the input plenum conduit second end.

2. The reaction chamber assembly of claim 1 wherein the input plenum conduit defines an input conduit flow direction extending from the input plenum conduit first end to the input plenum conduit second end, and is characterized by a first input plenum conduit cross section and a second input plenum conduit cross section, wherein the second input plenum cross section is orthogonal to the input conduit flow direction and the first input plenum cross section is orthogonal to the second input plenum cross section, and wherein an area of the first input plenum conduit cross section increases from the input plenum conduit first end to the input plenum conduit second end.

3. The reaction chamber assembly of claim 2 wherein the first input plenum conduit cross section is substantially triangular.

4. The reaction chamber assembly of claim 1 wherein the input plenum conduit second end forms an aperture having an aperture width that is substantially equal to or greater than the support width.

5. The reaction chamber assembly of claim 1 further comprising a vacuum source in fluidic communication with the reaction chamber for removing an outflow from the reaction chamber.

6. The reaction chamber assembly of claim 5 further comprising an output plenum including an output plenum conduit disposed below the substrate support area within the same floor space footprint as the reaction chamber, wherein the output plenum conduit is defined by the removable liner from an output plenum conduit first end in fluidic communication with the vacuum source and an opposing output plenum conduit second end for drawing the outflow from the output side, wherein a width of the output plenum conduit decreases from the output plenum conduit second end to the output plenum conduit first end.

7. The reaction chamber assembly of claim 6 wherein the output plenum conduit defines an output conduit flow direction extending from the output plenum conduit first end to the output plenum conduit second end, and is characterized by a first output plenum conduit cross section and a second output plenum conduit cross section, wherein the second output plenum cross section is orthogonal to the output conduit flow direction and the first output plenum cross section is orthogonal to the second output plenum cross section, and wherein an area of the first output plenum conduit cross section increases from the output plenum conduit second end to the output plenum conduit first end.

8. The reaction chamber assembly of claim 7 wherein the first output plenum conduit cross section is substantially triangular.

9. The reaction chamber assembly of claim 6 wherein the output plenum conduit second end forms an aperture having an aperture width that is substantially equal to or greater than the support width.

10. The reaction chamber assembly of claim 6, wherein the flow direction within the reaction chamber is substantially opposite to the flow direction in each of the input and output plenum conduits.

11. The reaction chamber assembly of claim 1 further comprising:

an outer wall assembly for enclosing an outer volume comprising outer walls and an outer aperture passing through one of the outer walls to the outer volume;

wherein the removable liner comprises liner walls and a chamber aperture passing through a front wall of the liner walls to provide access to the substrate support area through the chamber aperture, wherein the removable liner is configured to be installed into and removed from the outer volume through the outer aperture; and, an access door disposed on a front wall of the reaction chamber assembly and movable from an open position to expose the chamber aperture for loading and unloading substrates into the substrate support area through the front wall, to a closed position for substantially gas sealing the chamber aperture with a chamber aperture seal element attached to the access door.

12. The reaction chamber assembly of claim 11 wherein the outer aperture passes through a front wall of the outer wall assembly further comprising an outer aperture seal element attached to the access door for substantially gas sealing the outer aperture when the access door is in the closed position.

13. The reaction chamber assembly of claim 1, wherein the input side of the substrate support area comprises a front vertical flow channel extending from the input plenum conduit second end to a top wall of the reaction chamber substantially across the support width.

14. The reaction chamber assembly of claim 13, wherein the output side of the substrate support area comprises a back vertical flow channel extending from the output plenum second end to a top wall of the reaction chamber substantially across the support width.

15. The reaction chamber assembly of claim 14 wherein the substrate support area comprises a plurality of substrate support trays disposed substantially horizontally one above another between the front vertical flow channel and the back vertical flow channel.

16. A reaction chamber assembly suitable for depositing one or more solid material layers on one or more substrates contained therein comprising:

an outer wall assembly comprising outer walls for enclosing an outer volume, the outer wall assembly including an outer aperture passing through one of the outer walls to the outer volume;

a substantially unitary removable liner disposed inside the outer volume for enclosing a reaction chamber and a substrate support area wherein the substrate support area has a support width and wherein the removable liner is removable through the outer aperture without disassembly of the removable liner, the reaction chamber having a floor space footprint; and a source for delivering a flow of source material into the reaction chamber through a bottom wall of the removable liner;

wherein the bottom wall of the removable liner is formed to include an input plenum including an input plenum conduit disposed within the same floor space footprint as the reaction chamber, wherein the input plenum conduit is defined by the removable liner from an input plenum conduit first end for receiving the flow of source material therein to an opposing input plenum conduit second end shaped to deliver a substantially uniform flow of source material into the reaction chamber across the support width, wherein the bottom wall of the removable liner is further formed to include an output plenum including an output plenum conduit having an output plenum conduit first end in fluidic communication with a vacuum pump for removing a material outflow from the reaction chamber and an output plenum conduit second end formed to draw the outflow from the reaction chamber substantially uniformly drawing the across the support width, and wherein the input and output plenum conduits each expand in width from the conduit first end to the conduit second end.

17. The reaction chamber assembly of claim 16 wherein the input plenum conduit defines an input conduit flow direction extending from the input plenum conduit first end to the input plenum conduit second end and the output plenum conduit defines an output conduit flow direction extending from the output plenum conduit first end to the output plenum conduit second end, each of the plenum conduits characterized by a first conduit cross section and a second conduit cross section, wherein the second conduit cross section is orthogonal to the conduit flow direction and the first conduit cross section is orthogonal to the second conduit cross section, and wherein an area of the first conduit cross section increases from the conduit first end to the conduit second end.

18. The reaction chamber assembly of claim 17 wherein the first conduit cross section is substantially triangular.

19. The reaction chamber assembly of claim 17 wherein the first conduit cross section of the output plenum conduit is substantially trapezoidal.

20. The reaction chamber assembly of claim 17, wherein the flow direction within the reaction chamber is substantially opposite to the flow direction in each of the input and output plenum conduits.

21. The reaction chamber assembly of claim 16 wherein the substrate support area comprises an input side and an output side and a substantially horizontally disposed substrate support tray disposed between the input side and the output side.

22. The reaction chamber assembly of claim 21 wherein the horizontally disposed substrate support tray comprises a plurality of substrate support trays disposed substantially horizontally one above another with an open volume provided between substrate trays for the flow of source material to pass through.

23. The reaction chamber assembly of claim 22 wherein the input side comprises a front vertical flow channel extending from the input plenum conduit second end to a top wall of the reaction chamber substantially across a transverse width of the reaction chamber.

24. The reaction chamber assembly of claim 23 wherein the output side comprises a back vertical flow channel extending from the output plenum second end to a top wall of the reaction chamber substantially across a transverse width of the reaction chamber.

* * * * *